(12) United States Patent
Higgins et al.

(10) Patent No.: US 12,526,568 B2
(45) Date of Patent: Jan. 13, 2026

(54) EAR-WORN ELECTRONIC DEVICE INCORPORATING SKIN CONTACT AND PHYSIOLOGIC SENSORS

(71) Applicant: Starkey Laboratories, Inc., Eden Prairie, MN (US)

(72) Inventors: Sidney A. Higgins, Eden Prairie, MN (US); Kyle Olson, Eden Prairie, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 235 days.

(21) Appl. No.: 18/265,299

(22) PCT Filed: Oct. 14, 2021

(86) PCT No.: PCT/US2021/054966
§ 371 (c)(1),
(2) Date: Jun. 5, 2023

(87) PCT Pub. No.: WO2022/132299
PCT Pub. Date: Jun. 23, 2022

(65) Prior Publication Data
US 2024/0114282 A1  Apr. 4, 2024

Related U.S. Application Data

(60) Provisional application No. 63/125,695, filed on Dec. 15, 2020.

(51) Int. Cl.
*H04R 1/10* (2006.01)
*G06F 3/01* (2006.01)

(52) U.S. Cl.
CPC ........... *H04R 1/1041* (2013.01); *G06F 3/015* (2013.01); *H04R 1/1025* (2013.01); *H04R 1/1075* (2013.01)

(58) Field of Classification Search
CPC .. H04R 1/1041; H04R 1/1025; H04R 1/1075; G06F 3/015
See application file for complete search history.

(56) References Cited

U.S. PATENT DOCUMENTS 4,955,729 A   9/1990  Marx
8,647,270 B2  2/2014  LeBoeuf
(Continued)

FOREIGN PATENT DOCUMENTS

EP          3057139 A2    8/2016
WO    WO 2014/116924 A1  7/2014

OTHER PUBLICATIONS

International Patent Application No. PCT/US2021/062218, filed Dec. 7, 2021; International Search Report / Written Opinion issued Mar. 18, 2022; 11 pages.
(Continued)

*Primary Examiner* — Simon King
(74) *Attorney, Agent, or Firm* — Mueting Raasch Group

(57) ABSTRACT

An ear-worn electronic device comprising a housing configured to be worn in, at or about an ear of a wearer, audio processing circuitry disposed in or supported by the housing and comprising one or more microphones and an acoustic transducer, a controller disposed in the housing and coupled to the audio processing circuitry, and a power source disposed in the housing. A contact sensor is supported by the housing and coupled to the controller, the contact sensor configured to sense contact between the device and skin of the wearer. A physiologic sensor arrangement is coupled to the controller and configured to measure at least one physiologic parameter or physiologic condition of the wearer. The controller is configured to operate on signals received from
(Continued)

the physiologic sensor arrangement in response to the contact sensor sensing contact between the device and the wearer's skin.

17 Claims, 8 Drawing Sheets

(56) References Cited

U.S. PATENT DOCUMENTS

| | | |
|---|---|---|
| 2018/0020975 A1 | 1/2018 | Pohjonen |
| 2019/0098390 A1* | 3/2019 | Carino .................. H04R 5/033 |
| 2020/0187809 A1 | 6/2020 | Larsen |
| 2020/0288253 A1* | 9/2020 | De Haan ................ H04R 25/70 |

OTHER PUBLICATIONS

International Patent Application No. PCT/US2021/062218, filed Dec. 7, 2021; International Preliminary Report on Patentability issued Jun. 13, 2023; 8 pages.
International Patent Application No. PCT/US2021/054966, filed Oct. 14, 2021; International Search Report / Written Opinion issued Jun. 13, 2023; 9 pages.

\* cited by examiner

EAR-WORN ELECTRONIC DEVICE INCORPORATING SKIN CONTACT AND PHYSIOLOGIC SENSORS

RELATED APPLICATIONS

This application is the § 371 U.S. National Stage of International Application No. PCT/US2021/054966, filed Oct. 14, 2021, which claims the benefit of U.S. Provisional Application No. 63/125,695, filed Dec. 15, 2020, the contents of which are hereby incorporated by reference.

TECHNICAL FIELD

This application relates generally to ear-level electronic systems and devices, including hearing devices, personal amplification devices, hearing aids, bone conduction hearing devices, medical and consumer hearables, physiologic monitoring devices, biometric devices, position and/or motion sensing devices, and other ear-worn electronic devices.

SUMMARY

Embodiments are directed to an ear-worn electronic device comprising a housing configured to be worn in, at or about an ear of a wearer, audio processing circuitry disposed in or supported by the housing and comprising one or more microphones and an acoustic transducer, a controller disposed in the housing and coupled to the audio processing circuitry, and a power source disposed in the housing. A contact sensor is supported by the housing and coupled to the controller, the contact sensor configured to sense contact between the device and skin of the wearer. A physiologic sensor arrangement is coupled to the controller and configured to measure at least one physiologic parameter or physiologic condition of the wearer. The controller is configured to operate on signals received from the physiologic sensor arrangement in response to the contact sensor sensing contact between the device and the wearer's skin.

Embodiments are directed to an ear-worn electronic device comprising a housing configured to be worn in, at or about an ear of a wearer, audio processing circuitry disposed in or supported by the housing and comprising one or more microphones and an acoustic transducer, a controller disposed in the housing and coupled to the audio processing circuitry, and a power source disposed in the housing. A contact sensor is supported by the housing and coupled to the controller, the contact sensor configured to sense contact between the device and skin of the wearer. An optical physiologic sensor arrangement is coupled to the controller and configured to measure at least one physiologic parameter or physiologic condition of the wearer. The contact sensor and one or more elements of the optical physiologic sensor arrangement are co-located in or on the housing. The controller is configured to operate on signals received from the optical physiologic sensor arrangement in response to the contact sensor sensing contact between the device and the wearer's skin.

Embodiments are directed to a method of measuring at least one physiologic parameter or physiologic condition of a wearer of an ear-worn electronic device comprising generating, by a contact sensor of the device, a contact signal in response to sensing contact between the contact sensor and skin of the wearer, energizing, by a controller of the device, a physiologic sensor arrangement of the device in response to receiving the contact signal, measuring, by the physiologic sensor arrangement, at least one physiologic parameter or physiologic condition of the wearer, operating, by the controller, on signals received from the physiologic sensor arrangement in response to the contact sensor sensing contact between the housing and the wearer's skin, generating, by the controller, an output comprising data indicative of or generated from the physiologic sensor arrangement signals, and communicating the output to an electronic or communication device or system external of the ear-worn electronic device.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
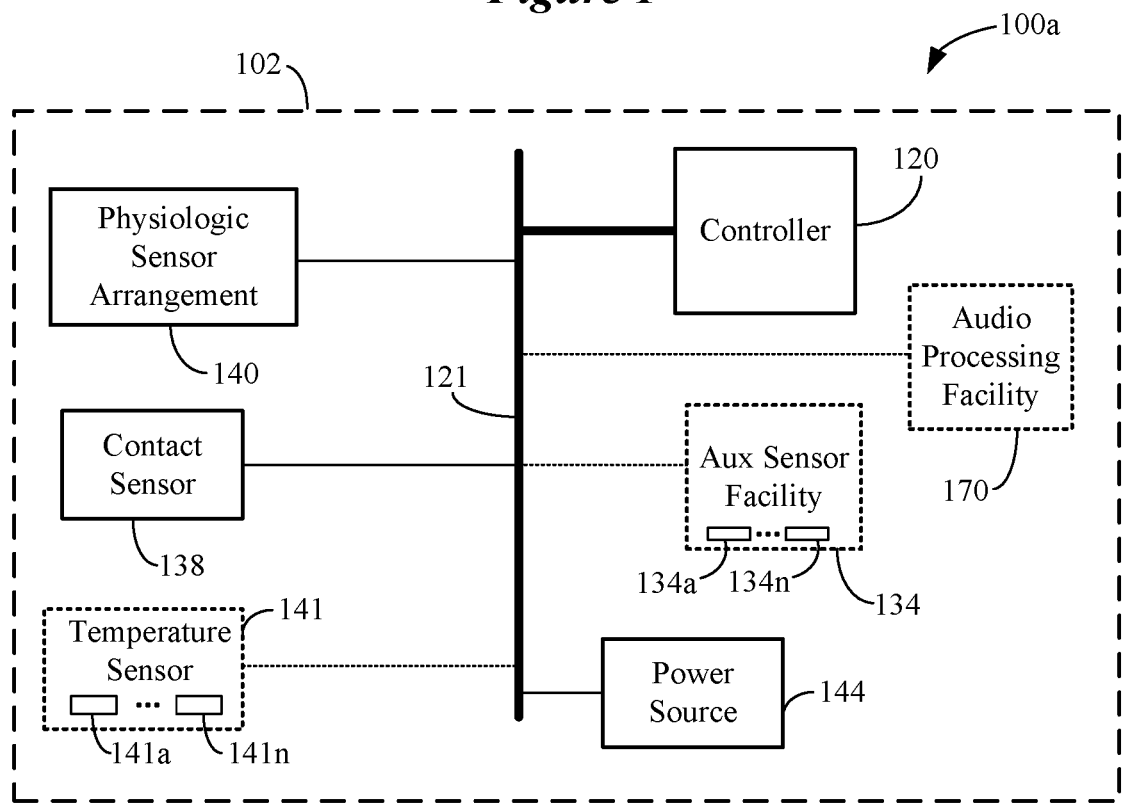
FIG. 1 is a block diagram of an ear-worn electronic device which includes a skin contact sensor and a physiologic monitoring facility comprising one or more physiologic sensors in accordance with any of the embodiments disclosed herein.

Embodiments of the disclosure are directed to an ear-worn electronic device which includes a skin contact sensor and one or more physiologic sensors. Due to their relatively small size, the size and, therefore, capacity of the battery housed within an ear-worn electronic device is necessarily limited. Conserving battery capacity is an important objective when designing an ear-worn electronic device. Ear-worn electronic devices disclosed herein include one or more physiologic sensors which consume varying amounts of power when in use. Ear-worn electronic devices disclosed herein also include a skin contact sensor configured to sense contact between the device and skin of wearer.

The skin contact sensor, alone or in cooperation with one or more auxiliary sensors, can be configured to prevent or limit false skin-device detections (e.g., a false positive or a false negative). In response to detecting contact between the device and the wearer's skin, the one or more physiologic sensors can be energized for sensing one or more physiologic parameters or physiologic conditions of the wearer. The one or more physiologic sensors can remain energized until a termination event is detected (e.g., expiration of a timer, collection of sufficient physiologic data) and/or the skin contact sensor senses an absence of skin-device contact. Ear-worn electronic devices disclosed herein advantageously reduce or eliminate wasteful power consumption by physiologic and/or other sensors of the devices. Ear-worn electronic devices disclosed herein provide for enhanced physiologic sensing due to robust sensing of skin-device contact which can indicate that one or more physiologic sensors of the device are properly or optimally positioned relative to the wearer's skin for operation.

The term ear-worn electronic device refers to a wide variety of electronic devices configured for deployment in, on or about an ear of a wearer. Representative ear-worn electronic devices of the present disclosure include, but are not limited to, in-the-canal (ITC), completely-in-the-canal (CIC), invisible-in-canal (IIC), in-the-ear (ITE), receiver-in-canal (RIC), behind-the-ear (BTE), and receiver-in-the-ear (RITE) type devices. Representative ear-worn electronic devices of the present disclosure include, but are not limited to, earbuds, electronic ear plugs, personal sound amplification devices, and other ear-worn electronic appliances. Ear-worn electronic devices of the present disclosure include various types of hearing devices, various types of physiologic monitoring and biometric devices, and combined hearing/physiologic monitoring devices. Ear-worn electronic devices of the present disclosure include restricted medical devices (e.g., devices regulated by the U.S. Food and Drug Administration), such as hearing aids and bone conduction hearing devices. Ear-worn electronic devices of the present disclosure include consumer electronic devices, such as consumer earbuds, consumer sound amplifiers, and consumer hearing devices (e.g., consumer hearing aids and over-the-counter (OTC) hearing devices), for example.

Embodiments of the disclosure are defined in the claims. However, below there is provided a non-exhaustive listing of non-limiting examples. Any one or more of the features of these examples may be combined with any one or more features of another example, embodiment, or aspect described herein.

Example Ex1. An ear-worn electronic device comprises a housing configured to be worn in, at or about an ear of a wearer, audio processing circuitry disposed in or supported by the housing and comprising one or more microphones and an acoustic transducer, a controller disposed in the housing and coupled to the audio processing circuitry, and a power source disposed in the housing. A contact sensor is supported by the housing and coupled to the controller, the contact sensor configured to sense contact between the device and skin of the wearer. A physiologic sensor arrangement is coupled to the controller and configured to measure at least one physiologic parameter or physiologic condition of the wearer. The controller is configured to operate on signals received from the physiologic sensor arrangement in response to the contact sensor sensing contact between the device and the wearer's skin.

Example Ex2. The device according to Ex1, wherein the contact sensor is configured to sense contact between the device and skin of the wearer's finger.

Example Ex3. The device according to Ex1 or Ex2, wherein the contact sensor is configured to sense contact between the device and skin of the wearer's ear.

Example Ex4. The device according to any of the preceding claims, wherein one or more elements of the physiologic sensor arrangement and the contact sensor are co-located on the housing.

Example Ex5. The device according to one or more of Ex1 to Ex4, wherein the physiologic sensor arrangement comprises an optical sensor configured to optically measure the physiologic parameter or physiologic condition of the wearer.

Example Ex6. The device according to a one or more of Ex1 to Ex5, wherein the physiologic sensor arrangement comprises an optical sensor configured to produce a photoplethysmogram (PPG).

Example Ex7. The device according to Ex6, wherein, in response to receiving signals from the optical sensor, the controller is configured to measure one or more of the wearer's heart rate, cardiac cycle, cardiac rhythm, cardiac arrhythmia, heart rate variability, oxygen saturation, respiration, hypovolemia, hypervolemia, blood pressure, and depth of anesthesia.

Example Ex8. The device according to Ex6, further comprising a motion sensor disposed in the housing, wherein the controller is configured to reduce or eliminate motion artifacts in signals produced by the PPG sensor using signals produced by the motion sensor.

Example Ex9. The device according to Ex6, wherein one or more elements of the optical sensor and the contact sensor are co-located on the housing.

Example Ex10. The device according to one or more of Ex1 to Ex9, wherein the physiologic sensor arrangement comprises an optical sensor arrangement comprising a first optical sensor configured to make a first physiologic measurement at the wearer's ear, and a second optical sensor configured to make a second physiologic measurement at the wearer's finger or thumb. The controller is configured to produce a multisite photoplethysmogram (PPG) using the first and second physiologic measurements.

Example Ex11. The device according to one or more of Ex1 to Ex10, wherein the controller is configured to energize the physiologic sensor arrangement for operation in response to the contact sensor sensing contact between the device and the wearer's skin, and de-energize the physiologic sensor arrangement in response to the contact sensor sensing an absence of contact between the device and the wearer's skin.

Example Ex12. The device according to one or more of Ex1 to Ex11, wherein the physiologic sensor arrangement comprises one or both of a temperature sensor arrangement configured to measure an absolute core body temperature of the wearer, and an optical sensor configured to optically measure the physiologic parameter or physiologic condition of the wearer.

Example Ex13. The device according to one or more of Ex1 to Ex12, wherein the physiologic sensor arrangement comprises a temperature sensor arrangement configured and arranged in or on the housing to measure an absolute core body temperature of the wearer at the wearer's forehead.

Example Ex14. The device according to one or more of Ex1 to Ex13, wherein the physiologic sensor arrangement comprises an electrical sensor configured to contact the wearer's skin, the power source comprises a rechargeable power source coupled to charging circuitry, the charging circuitry comprises first and second charge contacts situated at a wall of the housing, and the first and second charge contacts define electrical contacts of the electrical sensor.

Example Ex15. An ear-worn electronic device comprises a housing configured to be worn in, at or about an ear of a wearer, audio processing circuitry disposed in or supported by the housing and comprising one or more microphones and an acoustic transducer, a controller disposed in the housing and coupled to the audio processing circuitry, and a power source disposed in the housing. A contact sensor is supported by the housing and coupled to the controller, the contact sensor configured to sense contact between the device and skin of the wearer. An optical physiologic sensor arrangement is coupled to the controller and configured to measure at least one physiologic parameter or physiologic condition of the wearer. The contact sensor and one or more elements of the optical physiologic sensor arrangement are co-located in or on the housing. The controller is configured to operate on signals received from the optical physiologic sensor arrangement in response to the contact sensor sensing contact between the device and the wearer's skin.

Example Ex16. The device according to Ex15, wherein the contact sensor is configured and arranged on the housing to one or both of sense contact between the device and skin of the wearer's finger, and sense contact between the device and skin of the wearer's ear.

Example Ex17. The device according to Ex15 or Ex16, wherein the optical physiologic sensor arrangement is configured to produce a photoplethysmogram (PPG).

Example Ex18. The device according to one or more of Ex15 to Ex17, wherein the controller is configured to energize the optical physiologic sensor arrangement for operation in response to the contact sensor sensing contact between the device and the wearer's skin, and de-energize the optical physiologic sensor arrangement in response to the contact sensor sensing an absence of contact between the device and the wearer's skin.

Example Ex19. A method of measuring at least one physiologic parameter or physiologic condition of a wearer of an ear-worn electronic device comprises generating, by a contact sensor of the device, a contact signal in response to sensing contact between the contact sensor and skin of the wearer, energizing, by a controller of the device, a physiologic sensor arrangement of the device in response to receiving the contact signal, measuring, by the physiologic sensor arrangement, at least one physiologic parameter or physiologic condition of the wearer, operating, by the controller, on signals received from the physiologic sensor arrangement in response to the contact sensor sensing contact between the housing and the wearer's skin, generating, by the controller, an output comprising data indicative of or generated from the physiologic sensor arrangement signals, and communicating the output to an electronic or communication device or system external of the ear-worn electronic device.

Example Ex20. The method according to Ex19, comprising one or both of sensing, by the contact sensor, contact between the device and skin of the wearer's finger, and sensing, by the contact sensor, contact between the device and skin of the wearer's ear.

Example Ex21. The method according to Ex19 or Ex20, wherein the physiologic sensor arrangement produces a photoplethysmogram (PPG).

Example Ex22. The method according to one or more of Ex19 to Ex21 comprising energizing, by the controller, the physiologic sensor arrangement for operation in response to the contact sensor sensing contact between the device and the wearer's skin, and de-energizing, by the controller, the physiologic sensor arrangement in response to the contact sensor sensing an absence of contact between the device and the wearer's skin.

Example Ex23. The method according to one or more of Ex19 to Ex22, comprising measuring, by a temperature sensor arrangement of the device, an absolute core body temperature of the wearer from an ear or a forehead of the wearer.

Example Ex24. The method according to one or more of Ex19 to Ex23, wherein one or more elements of the contact sensor are co-located on the housing relative to one or more elements of the physiologic sensor arrangement.

The following discussion is directed to the ear-worn electronic device 100a-100g, 100g (referred to herein singularly or collectively as device 100a-100g) shown in FIGS. 1-5 and 7A-10. The device 100a-100g includes a contact sensor and one or more physiologic sensors in accordance with any of the embodiments disclosed herein. In some implementations, the device 100a-100g can be deployed in, on or about one ear of the wearer (e.g., left or right ear). In other implementations, a first device 100a-100g can be deployed in, on or about the wearer's left ear, and a second device 100a-100g can be deployed in, on or about the wearer's right ear. The first and second devices 100a-100g can have the same or different configuration and/or functionality). The first and second devices 100a-100g can operate cooperatively (e.g., via a near field magnetic inductive or radio frequency ear-to-ear link) or independently. In some implementations, a controller that operates on contact sensor and physiologic sensor signals can be incorporated in only one of two devices 100a-100g.

The ear-worn electronic device 100a-100g shown in FIGS. 1-5 and 7A-10 includes a housing 102 configured for deployment in, on or about an ear of a wearer. According to any of the embodiments disclosed herein, the housing 102 can be configured for deployment at least partially within the wearer's ear. For example, the housing 102 can be configured for deployment at least partially or entirely within an ear canal of the wearer's ear. In some configurations, the shape of the housing 102 can be customized for the wearer's ear canal (e.g., based on a mold taken from the wearer's ear canal). In other configurations, the housing 102 can be constructed from pliant (e.g., semisoft) material that, when inserted into the wearer's ear canal, takes on the shape of the ear canal.

In accordance with any of the embodiments disclosed herein, the device 100a-100g can be configured as a hearing device or a hearable which includes an audio processing facility 170. The audio processing facility 170 can include audio signal processing circuitry, an acoustic transducer (e.g., a speaker, receiver, bone conduction transducer) and optionally one or more microphones. In accordance with any of the embodiments disclosed herein, the device 100a-100g can be implemented as a physiologic (e.g., biometric) monitoring device and optionally include a sensor facility 134 in addition to a physiologic sensor arrangement 140. When implemented for physiologic monitoring, the device 100a-100g can include or exclude (e.g., be devoid of) the audio processing facility 170. The device 100a-100g can also incorporate a communication facility configured to effect communications between two of the devices 100a-100g and/or with an external electronic device, system and/or the cloud. The communication facility can include one or both of an RF transceiver/antenna and/or an NFMI transceiver/antenna (see, e.g., module 130 of device 100g shown in FIG. 10).

According to any of the embodiments disclosed herein, the housing 102 can be configured for deployment at least partially within the outer ear, such as from the helix to the ear canal (e.g., the concha cymba, concha cavum) and can extend up to or into the ear canal. According to any of the embodiments disclosed herein, the housing 102 can be configured for deployment at or on the wearer's outer ear (e.g., auricle or pinna), such as behind the wearer's ear or situated on or over (but in contact with) the wearer's ear without extending into the wearer's ear or ear canal.

The housing 102 of the ear-worn electronic device 100a-100g is configured to contain or support a number of components including a controller 120 operatively coupled a contact sensor 138 and a physiologic sensor arrangement 140 via a communication bus 121. In some configurations, a temperature sensor 141 is disposed in and/or on the housing 102 and operatively coupled to the controller 120 via the bus 121. In some configurations, an audio processing facility 170 is disposed in, on, and/or extending from the housing 102 and operatively coupled to the controller 120 via the bus 121. In some configurations, a sensor facility 134 comprising one or more auxiliary sensors 134a-134n is/are disposed in, on, and/or extending from the housing 102 and operatively coupled to the controller 120 via the bus 121. A power source 144 is disposed in the housing 102 and operatively coupled to provide power to power-consuming components of the device 100a-100g.

The contact sensor 138 is configured to sense contact between the housing 102 (and/or the contact sensor 138 itself) and skin of the wearer. The contact sensor 138 is typically an electrical sensor (e.g., bioelectric sensor), such as an impedance, conductance, resistance, capacitance or electrodermal activity (e.g., galvanic skin response) sensor. The contact sensor 138 can also include a pressure sensor, such as a strain gauge. The contact sensor 138 can be configured to sense for a change in one or any combination of impedance, conductance, resistance, capacitance, electrodermal activity, and pressure. In some configurations, the contact sensor 138 can be implemented as an optical sensor (e.g., IR sensor), a thermal sensor (e.g., a thermistor sensor), or a sensor comprising any combination of an electrical sensor, a pressure sensor, an optical sensor, and a thermal sensor. In some configurations, the contact sensor 138 is configured to sense contact between the housing 102 and skin of the wearer's finger. In other configurations, the contact sensor 138 is configured to sense contact between the housing 102 and skin of the wearer's ear or portion of the wearer's head adjacent the ear. In further configurations, the contact sensor 138 is configured to sense contact between the housing 102 and skin of the wearer's finger (e.g., at a first housing location) and sense contact between the housing 102 and skin of the wearer's ear or portion of the wearer's head adjacent the ear (e.g., at a second housing location).

For example, the contact sensor 138 can be coupled to a first electrode positioned on the housing 102 which is readily accessible to the wearer's finger or thumb when the device 100a-100g is deployed in or on the wearer's ear. The contact sensor 138 can be coupled to a second electrode positioned on the housing 102 at a location that makes contact with skin of the wearer's ear when the device 100a-100g is deployed in or on the wearer's ear. When deployed at or in the wearer's ear, the contact sensor 138 can be activated by the controller 120 (e.g., in response to detecting contact with the wearer's finger or thumb in addition to skin of the ear) to operate as a bioelectric sensor, such as an impedance, conductance, resistance, capacitance or electrodermal activity (e.g., a GSR, EDA) sensor. Bioelectric sensor data can be acquired during a period of time in which electrodes of the contact sensor 138 remain in contact with the wearer's skin.

By way of further example, the contact sensor 138 can be configured to sense cardiac electrical activity of the wearer. The contact sensor 138 can be coupled to a first electrode positioned on the housing 102 which is readily accessible to the wearer's finger or thumb when the device 100a-100g is deployed in or on the wearer's ear. The contact sensor 138 can be coupled to a second electrode positioned on the housing 102 at a location that makes contact with skin of the wearer's ear when the device 100a-100g is deployed in or on the wearer's ear. When deployed at or in the wearer's ear, the contact sensor 138 can be activated by the controller 120 (e.g., in response to detecting contact with the wearer's finger or thumb in addition to skin of the ear) to operate as a bioelectric ECG sensor. Sensing of the wearer's ECG can be performed, and ECG data can be acquired, during a period of time in which electrodes of the contact sensor 138 remain in contact with the wearer's skin.

The physiologic sensor arrangement 140 is configured to measure at least one physiologic parameter or physiologic condition of the wearer. One or more sensors of the physiologic sensor arrangement 140 can be situated on the housing 102 to position the sensor(s) within the wearer's ear (e.g., ear canal) and/or a portion of the wearer's head adjacent the ear. Alternatively or additionally, one or more sensors of the physiologic sensor arrangement 140 can be situated on the housing 102 to facilitate contact with the wearer's finger. In some configurations, two sensors of the physiologic sensor arrangement 140 can be situated on opposing surfaces of the housing 102 to facilitate contact with the wearer's thumb and one of the wearer's fingers (e.g., pinching opposing end surfaces of the housing 102). The physiologic sensor arrangement 140 typically includes at least one optical sensor, such as a photoplethysmography (PPG) sensor (e.g., a pulse oximeter). In some embodiments, the physiologic sensor arrangement 140 includes two, three or more of such optical sensors. It is understood that the an optical sensor of the physiologic sensor arrangement 140 can include one or multiple light emitters (e.g., LEDs, laser diodes) and one or multiple light detectors (e.g., photodiodes, photon detectors).

As previously discussed, the sensor facility 134 can be incorporated in the device 100a-100g and provide enhanced physiologic and/or biometric sensing. The sensor facility 134 comprises one or more auxiliary sensors 134a-134n disposed in, on, and/or extending from the housing 102 and operatively coupled to the controller 120 via the bus 121. One or more auxiliary sensors 134a-134n of the sensor facility 134 can be situated on or near a surface of the housing 102 that facilitates contact or near-contact with a specified body portion of the wearer (e.g., the wearer's forehead, chest proximate the heart, lungs, abdomen, upper leg, wrist, etc.). One or more auxiliary sensors 134a-134n can be incorporated in housings physically separate from the housing 102 of the device 100a-100g. Such auxiliary sensors 134a-134n can be configured for attachment to, and sensing at, specified portions of the wearer's body (e.g., a body network of physiologic/biometric sensors). Such auxiliary sensors 134a-134n can include a communication device (e.g., an RF or a near-field communication (NFC/NFMI) transmitter or transceiver) configured to communicate sensor signals to the device 100a-100g and/or an external electronic device (e.g., smartphone).

The physiologic sensor arrangement 140, alone or in combination with the sensor facility 134, can include one or more of a PPG sensor, an $SpO_2$ sensor, an EKG or ECG sensor, a blood pressure sensor, a respiration sensor, a blood glucose sensor, an EEG sensor, an EMG sensor, and an EOG sensor. Representative examples of such sensors are disclosed in US Pat. Pub. Nos. 2018/0014784 (Heeger et al.), 2013/0216434 (Ow-Wing), and 2010/0253505 (Chou), and in U.S. Pat. No. 9,445,768 (Alexander et al.) and U.S. Pat. No. 9,107,586 (Bao), each of which is incorporated herein by reference in its entirety. The physiologic sensor arrangement 140, alone or in combination with the sensor facility 134, provides the device 100a-100g with a vital signs monitoring facility for monitoring vital signs of the device wearer. The physiologic sensor arrangement 140, alone or in combination with the sensor facility 134, provides physiologic/biometric sensor data that allows the controller 120 to generate and output vital signs data to the wearer (e.g., via an audio processing facility) and/or an external electronic device or system (e.g., smartphone, charging unit, internet/cloud communication interface). The controller 120 can generate an output in the form of an alert to the wearer and/or an external electronic device in response to the controller 120 detecting an abnormal or suspect physiologic parameter or condition.

As previously discussed, a temperature sensor 141 can be disposed in and/or on the housing 102 and operatively coupled to the controller 120 via the bus 121. The temperature sensor 141 can include one or more temperature sensing elements 141a-141n, such as one or more thermistors. Other types of temperature sensors 141 can be used, such as thermocouples, bimetallic temperature sensors, resistance temperature detectors (RTDs), semiconductor-based temperature sensors, digital thermistors, and other types of resistance temperature sensors. In some configurations, the temperature sensor 141 can be used to detect presence of the wearer's finger or body part during contact detection between the housing 102 and the wearer's finger or body part. For example, the temperature sensor 141 can be used by the controller 120 to confirm skin-device contact sensed by the contact sensor 138. The combined use of the contact sensor 138 and the temperature sensor 141 provides for robust (e.g., duplicative) skin-device contact detection by reducing or eliminating false contact detection events. In such configurations, the temperature sensor 141 (e.g., thermistor) need only provide a relative temperature measurement. Accordingly, relatively low-cost, reduced-precision temperature sensing elements (e.g., thermistors) can be incorporated in such device configurations.

In other configurations, the temperature sensor 141 can be configured to provide an absolute temperature measurement, such as a body core temperature measurement. The temperature sensor 141 can include a single temperature sensing element 141a (e.g., a single thermistor) or two or more temperature sensing elements 141a-141n (e.g., two thermistors). Various known techniques can be implemented by the controller 120 to calculate core body temperature of the wearer using signals produced by the temperature sensor 141. Signals generated by a temperature sensor 141 comprising two thermistors 141a, 141b can be used by the controller 120 together with a heat balance equation to calculate a wearer's absolute core body temperature from within the wearer's ear canal. Representative examples of various thermistors 141a, mounting configurations, and signal processing techniques, including calculating absolute core body temperature, are disclosed in commonly owned, co-pending U.S. Published Patent Application No. 2019/0117155, which is incorporated herein by reference.

Signals generated by the contact sensor 138 and the physiologic sensor arrangement 140 are communicated to the controller 120. The controller 120 is configured to operate on signals received from the physiologic sensor arrangement 140 in response to the contact sensor 138 sensing contact between the housing 102 and the wearer's skin. In some configurations, signals generated by the contact sensor 138, the physiologic sensor arrangement 140, and the temperature sensor 141 are communicated to the controller 120, and the controller 120 is configured to operate on signals received from the physiologic sensor arrangement 140 in response to the contact sensor 138 and the temperature sensor 141 respectively sensing contact between the housing 102 and the wearer's skin.

For example, the controller 120 can be configured to operate on signals received from the physiologic sensor arrangement 140 only after receiving signals from the contact sensor 138 in response to the contact sensor 138 sensing contact between the housing 102 and the wearer's skin. The controller 120, for example, can be configured to place the physiologic sensor 140 in a de-energized state in response to the contact sensor 138 sensing an absence of contact between the housing 102 and the wearer's skin. The physiologic sensor 140 can remain in a de-energized state until the controller 120 detects skin-device contact responsive to the contact sensor 138, which advantageously conserves power. Conservation of ear-worn electronic device power can be enhanced by configuring the controller 120 to energize the physiologic sensor 140 for operation in response to the contact sensor 138 sensing contact between the housing 102 and the wearer's skin, and de-energize the physiologic sensor 140 in response to the contact sensor 138 sensing an absence of contact between the housing 102 and the wearer's skin. In any of these and other configurations, the controller 120 can be configured to confirm skin-device detection by the contact sensor 138 by additionally using signals generated by the temperature sensor 141 indicative of contact between the housing 102 and the wearer's skin.

The physiologic sensor arrangement 140 can comprise an optical sensor configured to optically measure one or more physiologic parameters or physiologic conditions of the wearer. The physiologic sensor arrangement 140 can comprise an optical sensor configured to produce a photoplethysmogram (PPG). The physiologic sensor arrangement 140 can by any type of PPG sensor, such as a pulse oximeter. The physiologic sensor arrangement 140 is configured to generate sensor signals when energized by the controller 120 and when in contact or near-contact with the wearer's skin (e.g., skin of the wearer's finger, ear, or head proximate or behind the ear). The physiologic sensor arrangement 140 can be configured to produce a variety of sensor signals which, when processed by the controller 120 or a processor of an external electronic device configured to operably couple to the controller 120, can be used to measure a variety of physiologic parameters or conditions of the wearer.

For example, the controller 120 or a processor of an external electronic device configured to operably couple to the controller 120 can be configured to measure one or more of the wearer's heart rate, cardiac cycle, cardiac rhythm, cardiac arrhythmia, heart rate variability, oxygen saturation, respiration, hypovolemia, hypervolemia, blood pressure, and depth of anesthesia. In addition to an optical (e.g., PPG) sensor, and as previously discussed, the physiologic sensor arrangement 140, alone or in combination with the sensor facility 134, can include one or more of an $SpO_2$ sensor, an EKG or ECG sensor, a blood pressure sensor, a respiration sensor, a glucose sensor, an EEG sensor, an EMG sensor, and an EOG sensor.

In some configurations, an optical sensor of the physiologic sensor arrangement 140 can be arranged on the housing 102 of the ear-worn electronic device 100a-100g to sense ambient light. In response to signals generated by the optical sensor, the controller 120, or a processor of an external electronic device configured to operably couple to the controller 120, can be configured to measure the duration and/or intensity of ambient light to which the wearer of the device 100a-100g is exposed. The controller 120, or a processor of an external electronic device configured to operably couple to the controller 120, can be configured to monitor the wearer's exposure to sunlight using signals indicative of sensed ambient light received from the optical sensor.

Figure 2:
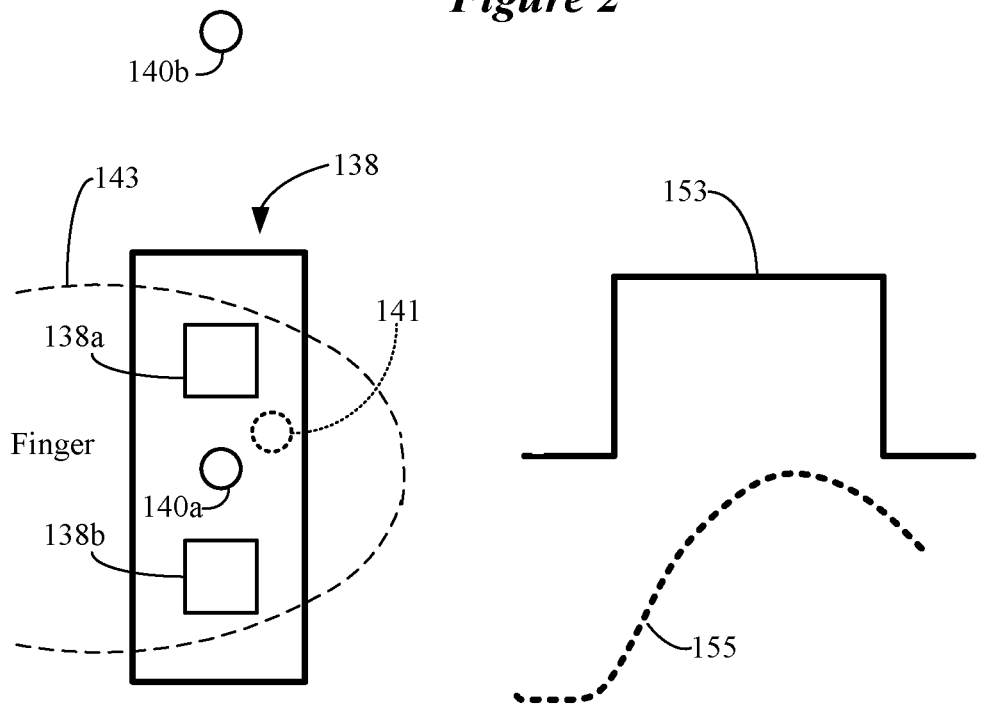
FIG. 2 shows a skin contact sensor of an ear-worn electronic device which includes one or more co-located physiologic sensors in accordance with any of the embodiments disclosed herein.
Figure 3:
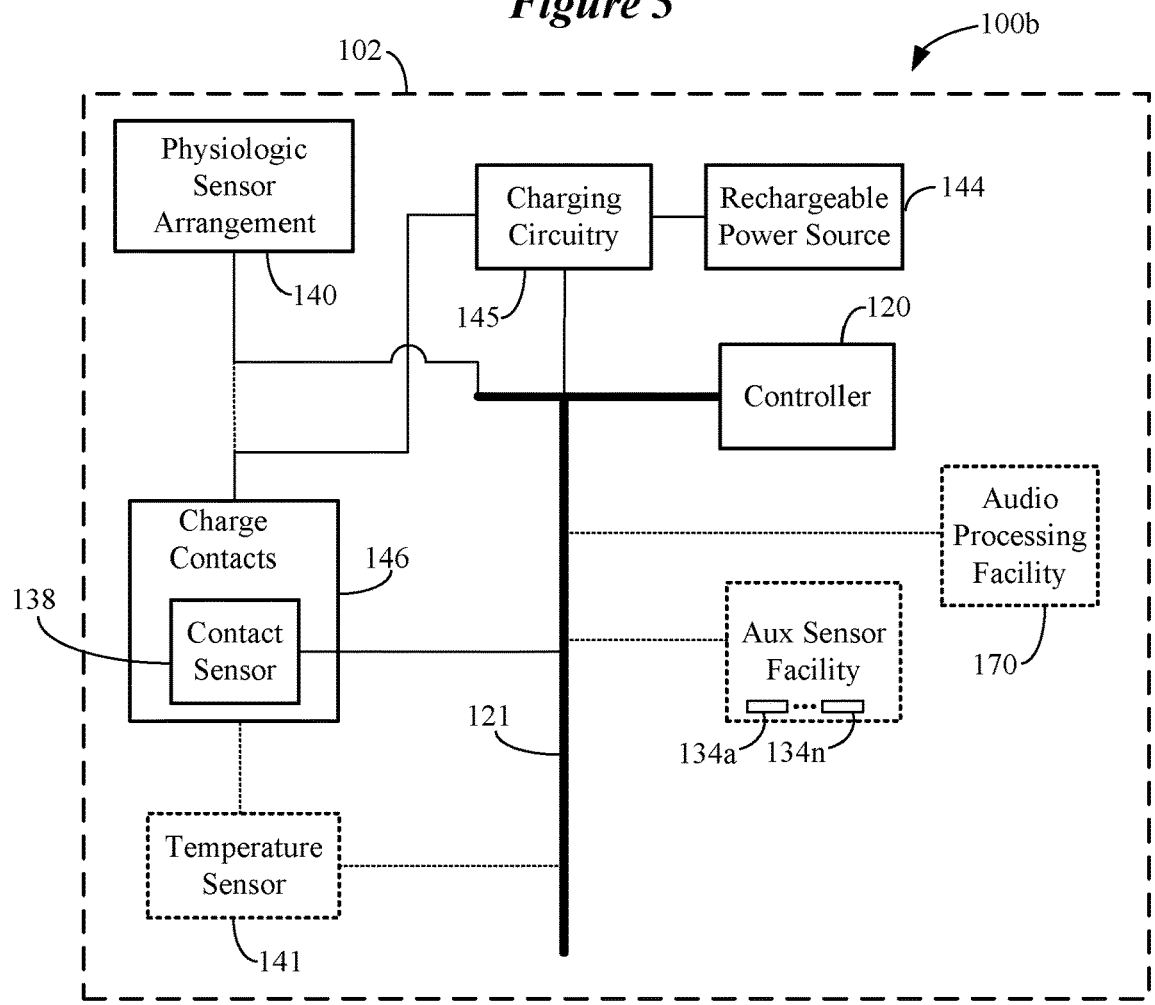
FIG. 3 is a block diagram of an ear-worn electronic device which includes a skin contact sensor and a physiologic monitoring facility comprising one or more physiologic sensors in accordance with any of the embodiments disclosed herein.
Figure 4:
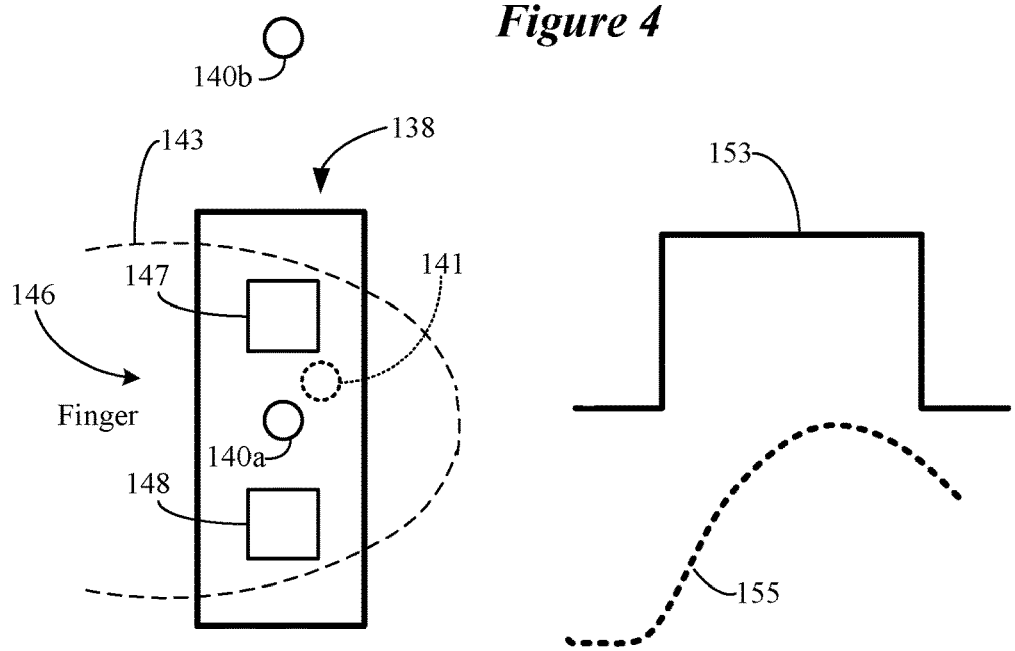
FIG. 4 shows a skin contact sensor of an ear-worn electronic device which includes one or more co-located physiologic sensors in accordance with any of the embodiments disclosed herein.

As shown in FIGS. 2-4, the physiologic sensor arrangement 140 (e.g., physiologic sensor 140a) and the contact sensor 138 can be co-located on the housing 102 of the ear-worn electronic device 100a-100g. For example, the physiologic sensor 140a and the contact sensor 138 can be located adjacent to each other on the housing 102 such that a wearer's finger 143 applied to, and covering, the contact sensor 138 also contacts or covers the physiologic sensor 140a. In other configurations, the physiologic sensor arrangement 140 (e.g., physiologic sensor 140b) can be spaced apart from the contact sensor 138 on the housing 102 (e.g., situated on a different surface of the housing 102).

In some configurations, the physiologic sensor arrangement 140 can include an optical sensor arrangement comprising a multiplicity of optical (e.g., PPG) sensors 140a-140n situated at different (e.g., spaced apart) locations of the housing 102. The multiplicity of optical sensors 140a-140n can be arranged and configured to cooperate together (e.g., for sensing a common physiologic parameter or condition) or to operate independently of one another (e.g., for sensing different physiologic parameters or conditions).

Figure 7A:
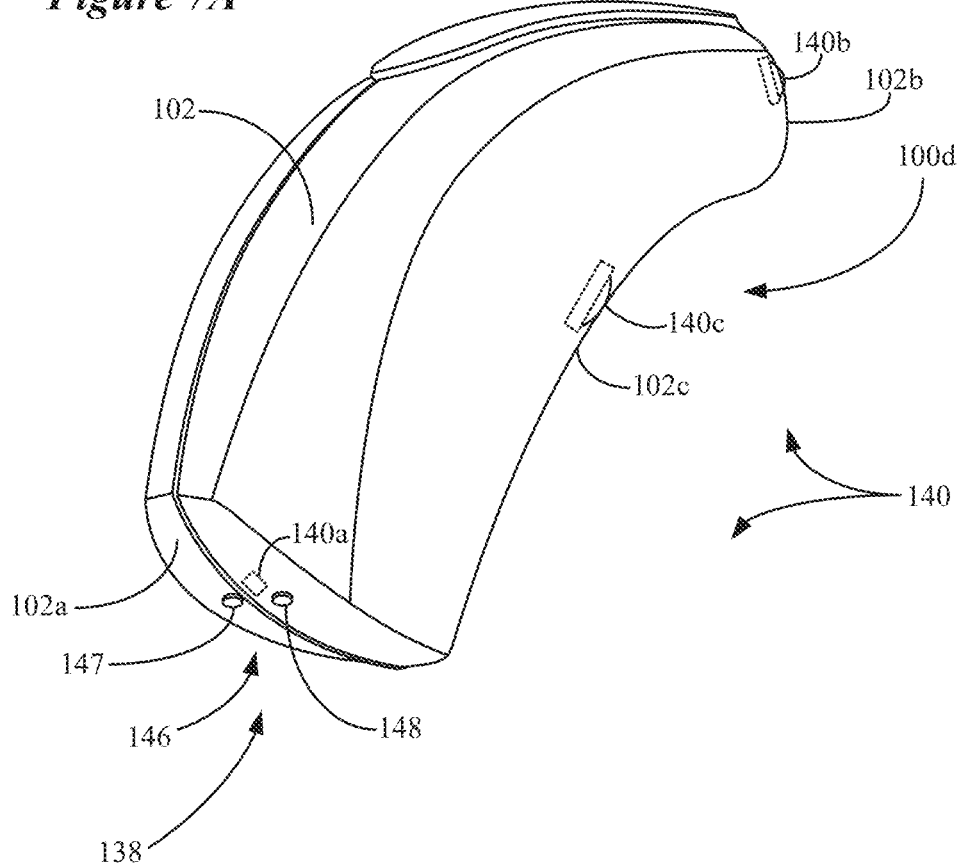
FIGS. 7A and 7B illustrate an ear-worn electronic device which includes a skin contact sensor and a physiologic monitoring facility comprising one or more physiologic sensors in accordance with any of the embodiments disclosed herein.
Figure 7B:
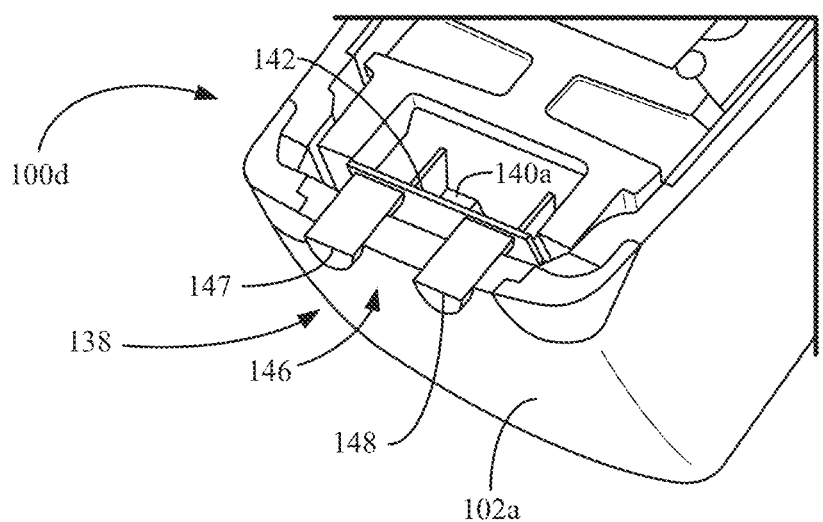

According to one configuration, and with reference to FIG. 4, the physiologic sensor arrangement 140 can include a first optical sensor 140a configured to make a first physiologic measurement at the wearer's finger 143, and a second optical sensor 140b configured to make a second physiologic measurement at the wearer's ear. In another configuration, and as shown in FIGS. 7A and 7B, the physiologic sensor arrangement 140 can include a first optical sensor 140a configured to make a first physiologic measurement at the wearer's thumb, and a second optical sensor 140b configured to make a second physiologic measurement at the wearer's finger 143 (e.g., by applying a pinch force to opposing ends of the housing 102).

In some configurations, the physiologic sensor arrangement 140 can include the first optical sensor 140a configured to make the first physiologic measurement at the wearer's ear, the second optical sensor 140b configured to make the second physiologic measurement at the wearer's finger 143, and a third optical sensor 140c positioned between the first and second optical sensors 140a, 140b and configured to make the third physiologic measurement at the wearer's ear. The controller 120, or a processor of an external electronic device configured to operably couple to the controller 120, can be configured to produce a multisite photoplethysmogram (PPG) using two or more of the first, second, and third physiologic measurements. For example, controller 120, or a processor of an external electronic device configured to operably couple to the controller 120, can be configured to generate data used to assess one or more of suspected peripheral arterial disease, autonomic dysfunction, endothelial dysfunction, and arterial stiffness of the wearer.

As previously discussed, the housing 102 of the ear-worn electronic device 100a-100g can incorporate a sensor facility 134 which can include one or more sensors 134a-134n. The sensor facility 134 can include signal processing circuitry configured to process signals produced by the one or more sensors 134a-134n. Although not shown, the physiologic sensor arrangement 140 can also include signal processing circuitry configured to process signals produced by the one or more sensors of the physiologic sensor arrangement 140. The sensor facility 134 can include one or more motion sensors (e.g., motion sensor 134b shown in FIG. 10). The one or more motion sensors 134b can include one or more of accelerometers, gyros, and magnetometers. For example, the motion sensor 134b can be implemented to include a multi-axis (e.g., 9-axis) sensor, such as an IMU. A suitable IMU is disclosed in commonly owned U.S. Pat. No. 9,848,273, which is incorporated herein by reference.

The motion sensor 134b can be disposed in or on the housing 102 and coupled to the controller 120. In some configurations, the controller 120 can be configured to reduce or eliminate motion artifacts in signals produced by one or more optical sensors of the physiologic sensor arrangement 140 and/or sensor facility 134 using signals produced by the motion sensor 134b. In such configurations, the contact sensor 138 and the optical sensor(s) of the physiologic sensor arrangement 140 and/or sensor facility 134 can be co-located on the housing 102 or spaced apart from one another on the housing 102.

Referring again to FIG. 2, the contact sensor 138 includes a first electrical contact 138a spaced apart from a second electrical contact 138b. In the configuration shown in FIG. 2, the spacing between the first and second electrical contacts 138a, 138b provides for concurrent contact with an average-sized finger 143 or a thumb of a wearer of the device 100a-100g. The first and second electrical contacts 138a, 138b can be situated at any location of the housing 102. The first and second electrical contacts 138a, 138b can have a spacing of about 0.25 mm to about 16 mm, and have any shape (e.g., round, oval, square, rectangular, arbitrary).

The first and second electrical contacts 138a, 138b are coupled to contact detection circuitry (see, e.g., FIG. 6) and to the controller 120. The first and second electrical contacts 138a, 138b coupled to contact detection circuitry define components of a bioelectric sensor configured to sense or measure one or more of impedance, conductance, resistance, capacitance, electrodermal activity, and pressure sensor in response to contact between the contact sensor 138 and the wearer's skin. In some configurations, the contact sensor 138 can include a capacitance sensor.

In response to contact between the wearer's skin (e.g., finger 143) and the first and second electrical contacts 138*a*, 138*b*, the contact detection circuitry generates a contact signal 153 such as a voltage or current pulse. In response to receiving the contact signal 153, the controller 120 energizes the physiologic sensor arrangement 140, such as physiologic sensor 140*a* shown positioned between the first and second electrical contacts 138*a*, 138*b* or physiologic sensor 140*b*/104*c* positioned elsewhere on the housing 102. As was previously discussed, a temperature sensor 141 can also be positioned between or adjacent the first and second electrical contacts 138*a*, 138*b*, which measures a change in temperature due to contact or near-contact with the wearer's finger 143. In configurations that include the temperature sensor 141, the controller 120 energizes the physiologic sensor arrangement 140 in response to receiving the contact signal 153 and a temperature signal 155 generated by the temperature sensor 141. As was previously discussed, the addition of the temperature sensor 141 enhances robustness of the contact detection circuitry of the device 100*a*-100*g*.

FIGS. 3 and 4 illustrate a contact sensor 138 in accordance with any of the embodiments disclosed herein. The ear-worn electronic device 100*b* shown in FIGS. 3 and 4 includes charging circuitry 145 coupled to a rechargeable power source 144 (e.g., a lithium-ion battery) and charge contacts 146. The controller 120 is operatively coupled to the charging circuitry 145 and other components of the device 100*b* via bus 121. The charge contacts 146 include first and second charge contacts 147, 148 which are spaced apart from one another on the housing 102. The spacing between charge contacts 147, 148 is preferably wide enough to provide electrical isolation therebetween yet small enough to facilitate contact with an average person's finger 143 when the finger 143 is touching the contact sensor 138 (see spacing and shape examples discussed above).

The charge contacts 146 typically comprise at least one positive contact and at least one negative or ground contact exposed on an exterior surface of the housing 102. When recharging the rechargeable power source 144, the device 100*b* is typically placed in a charging unit comprising positive and negative charge contacts which electrically couple to corresponding positive and negative charge contacts 146 of the device 100*b*. The charging circuitry 145 of the device 100*b* cooperates with charging circuitry of the charging unit to charge the rechargeable power source 144. The charging circuitry 145 of the device 100*b* can be configured to cooperate with the charging unit in accordance with the representative examples disclosed in commonly owned, co-pending U.S. Published Patent Application No. 2019/0386,498, which is incorporated herein by reference in its entirety.

The contact sensor 138 comprising the charge contacts 146 shown in FIGS. 3 and 4 is configured to sense for a change in one or any combination of impedance, conductance, resistance, electrodermal activity, and pressure. The contact sensor 138 can also include temperature sensor 141 as an operative component when sensing for contact with the wearer's skin (e.g., finger). The temperature sensor 141 can be coupled to the charge contacts 146 and the controller 120 in some configurations. In various configurations, one or more sensors of the physiologic sensor arrangement 140 can be coupled to the charge contacts 146 and the controller 120. In further configurations, the temperature sensor 141 and one or more sensors of the physiologic sensor arrangement 140 can be coupled to the charge contacts 146.

In response to contact between the wearer's skin (e.g., finger 143) and the first and second charge contacts 147, 148, the contact detection circuitry generates a contact signal 153 such as a voltage or current pulse. In response to receiving the contact signal 153, the controller 120 energizes the physiologic sensor arrangement 140, such as physiologic sensor 140*a* shown positioned between the first and second charge contacts 147, 148 or physiologic sensor 140*b* positioned elsewhere on the housing 102. The temperature sensor 141 can also be positioned between or adjacent the first and second charge contacts 147, 148, which measures a change in temperature due to contact or near-contact with the wearer's finger 143. In configurations that include the temperature sensor 141, the controller 120 energizes the physiologic sensor arrangement 140 in response to receiving the contact signal 153 and they temperature signal 155 generated by the temperature sensor 141. The addition of the temperature sensor 141 enhances robustness of the contact detection circuitry of the device 100*b*. The contact detection sensor(s) and circuitry of any of the disclosed embodiments can be implemented in accordance with any of the embodiments disclosed in commonly owned, co-pending U.S. Patent Application Ser. No. 63/044,299 filed on Jun. 25, 2020 and entitled User-Actuatable Touch Control for an Ear-Worn Electronic Device, which is incorporated herein by reference in its entirety.

Figure 5:
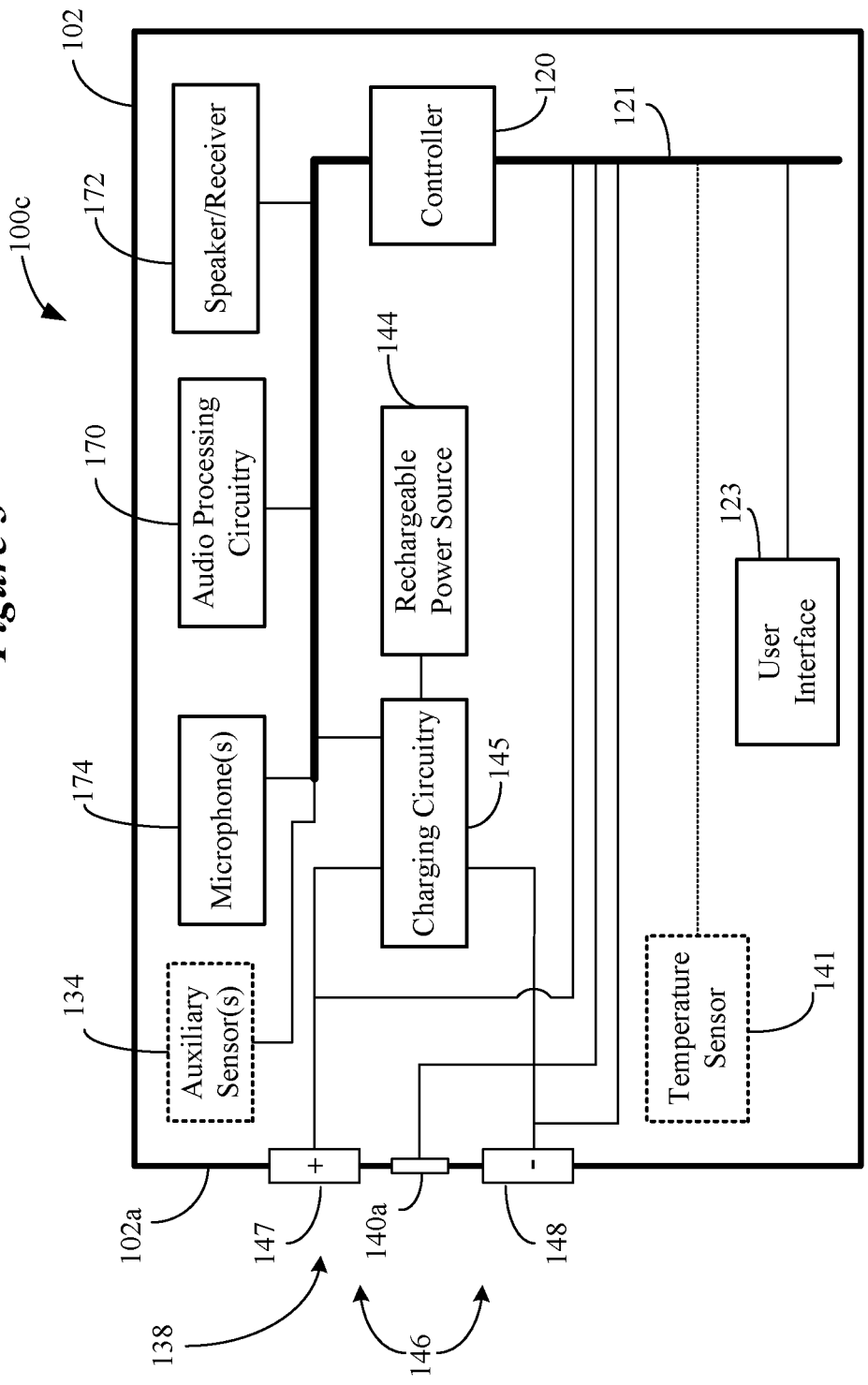
FIG. 5 is a block diagram of an ear-worn electronic device which includes a skin contact sensor and a physiologic monitoring facility comprising one or more physiologic sensors in accordance with any of the embodiments disclosed herein.

FIG. 5 illustrates an ear-worn electronic device 100*c* in accordance with any of the embodiments disclosed herein. The device 100*c* is configured as a hearing device, such as any of those discussed herein (e.g., an earbud, hearable, personal sound amplification device, hearing aid). The ear-worn electronic device 100*c* shown in FIG. 5 includes a housing 102 configured for deployment in, on or about an ear of a wearer as previously described. For example, the housing 102 can be configured for deployment at least partially within the wearer's ear. By way of further example, the housing 102 can be configured for deployment at least partially or entirely within an ear canal of the wearer's ear. In another representative configuration, the housing 102 can be configured for deployment at or on the wearer's outer ear, such as behind the wearer's ear or situated on or over the wearer's ear without extending into the wearer's ear or ear canal.

The device 100*c* includes an audio processing facility 170 coupled to a speaker or receiver 172 and one or more microphones 174. The audio processing facility 170 can include audio signal processing circuitry (e.g., analog front-end, analog-to-digital converters, digital-to-analog converters, DSP, various analog and digital filters). The one or more microphones 174 can include one or more discrete microphones or a microphone array(s) (e.g., configured for microphone array beamforming). A multiplicity of microphones 174 can be situated at different locations of the housing 102.

The housing 102 is configured to contain or support a number of other components including charging circuitry 145 coupled to a rechargeable power source 144 (e.g., a lithium-ion battery) and charge contacts 146. A controller 120 is operatively coupled to the charging circuitry 145 and the audio processing circuitry 170, among other components of the device 100*c*. The charge contacts 146 typically comprise at least one positive contact 147 and at least one negative or ground contact 148 exposed on an exterior surface 102*a* of the housing 102. The charge contacts 146 are configured to electrically couple to corresponding charge contacts of an external charging unit as previously described.

The device 100c incorporates a contact sensor 138 and a physiologic sensor arrangement 140 (e.g., PPG sensor 140a) of a type previously described. In some configurations, the contact sensor 138 comprises positive and negative charge contacts 147, 148 as electrical sensing elements. In other configurations, the contact sensor 138 incudes at least a pair of electrical contacts (e.g., 138a, 138b) separate from the charge contacts 146. The device 100c can incorporate a temperature sensor 141, such as a single thermistor or multiple thermistors coupled to the controller 120. The device 100c can incorporate one or more auxiliary sensors 134, such as those discussed previously (e.g., an IMU). The device 100c can include a user interface 123, such as one or more switches or buttons, for receiving inputs from the wearer of the device 100c. The user interface 123 can be configured to receive single and multiple inputs for implementing a number of different functions or operations by the controller 120, including memory settings, audio output settings, microphone settings, etc.

In addition to these and other functions, the user interface 123 can be configured to receive an input from the wearer of the device 100c to change speech enhancement parameters of the device 100c, such as enabling/disabling of speech enhancement, fixed or adaptable cutoff frequency, etc. Other parameters, such as upper and lower bounds the adaptable cutoff frequency may be set by a user or technician via the user interface 123, e.g., to adapt performance to suit the level of hearing impairment of the user of the device 100c. A speech enhancement module of the device 100c can be implemented in software, hardware, or a combination of hardware and software. The speech enhancement module can be a component (e.g., processor) of, or integral to, the controller 120 or another processor (e.g., a special-purpose DSP) coupled to the controller 120. The speech enhancement module can be configured to detect speech in different types of acoustic environments. The different types of sound can include speech, music, and several different types of noise (e.g., wind, transportation noise and vehicles, machinery), etc., and combinations of these and other sounds (e.g., transportation noise with speech).

Figure 10:
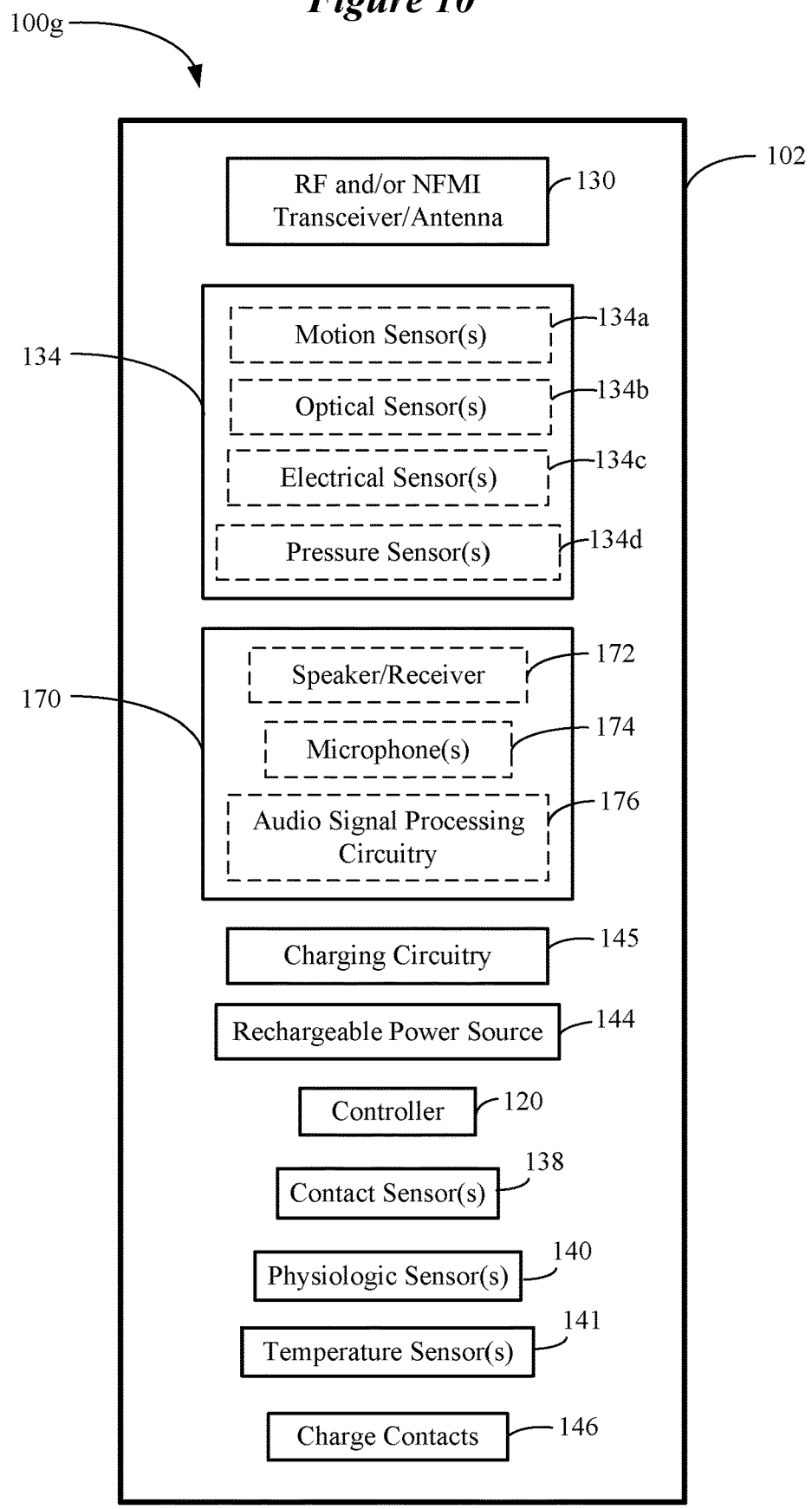
FIG. 10 is a block diagram of an ear-worn electronic device which includes a skin contact sensor and a physiologic monitoring facility comprising one or more physiologic sensors in accordance with any of the embodiments disclosed herein.

The device 100c (and other devices 100a, 100b, 100d-100g) can include one or more communication devices coupled to one or more antenna arrangements (see, e.g., module 130 shown in FIG. 10). For example, one or more communication devices can include one or more radios that conform to an IEEE 802.11 (e.g., WiFi®) or Bluetooth® (e.g., BLE, Bluetooth® 4. 2, 5.0, 5.1, 5.2 or later) specification, for example. In addition, or alternatively, the device 100c (and other devices 100a, 100b, 100d-100g) can include a near-field magnetic induction (NFMI) sensor (e.g., an NFMI transceiver coupled to a magnetic antenna) for effecting short-range communications (e.g., ear-to-ear communications, ear-to-kiosk communications).

Figure 6:
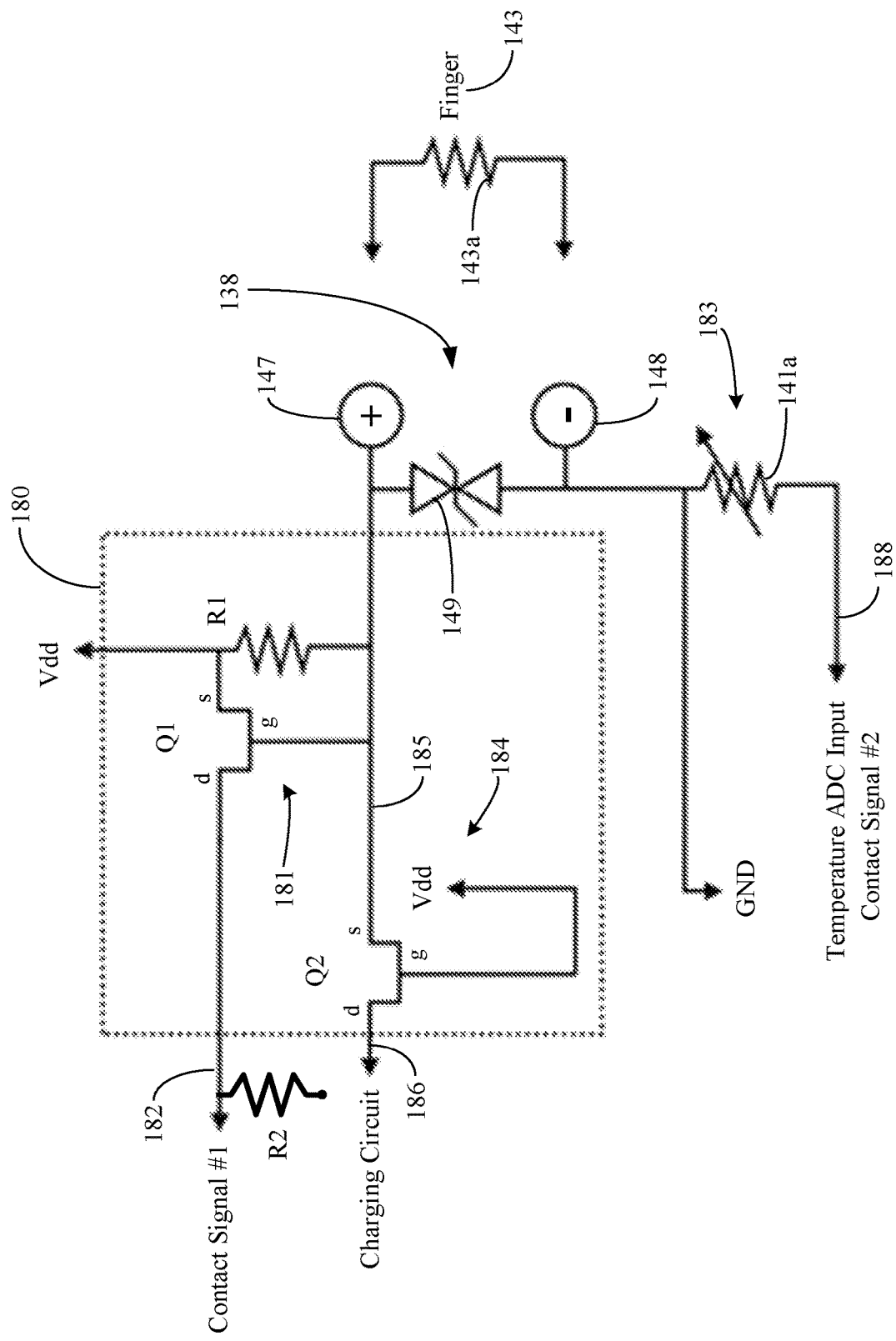
FIG. 6 shows a contact detection circuit integral or coupled to a skin contact sensor of an ear-worn electronic device in accordance with any of the embodiments disclosed herein.

FIG. 6 illustrates a contact detection circuit 180 of an ear-worn electronic device 100a-100g in accordance with any of the embodiments disclosed herein. The contact detection circuit 180 can be implemented as an ASIC, such as a 4-pin ASIC. The components used to construct the contact detection circuit 180 are widely available. The contact detection circuit 180 includes or is coupled to a contact sensor 138 which incorporates positive and negative charge contacts 147, 148 consistent with the device configuration shown in FIGS. 3 and 4. It is understood that the contact detection circuit 180 can alternatively incorporate electrical contacts 138a, 138b separate from the charge contacts 147, 148 consistent with the device configuration shown in FIGS. 1 and 2.

The contact detection circuit 180 is electrically coupled to positive and negative charge contacts 147, 148 of the contact sensor 138. The contact detection circuit 180 includes a first section 181 configured to electrically sense contact between a wearer's finger 143 and the positive and negative contacts 147, 148 of the contact sensor 138. The first section 181 includes a first field effect transistor (FET) Q1, such as a PMOS FET, with a gate, g, coupled to a charging circuit line 185 connected to positive contact 147. A source, s, of Q1 is coupled to a voltage source having a voltage of Vdd (a lithium-ion battery voltage).

A drain, d, of Q1 is coupled to an output 182 over which a Contact Signal #1 can be communicated to the controller 120 of the device 100a-100g. The first section 181 also includes a resistor R1 having a relatively high resistance, such as 10 MΩ, coupled between the charging circuit line 185 and the source voltage Vdd line. It is noted that a pulldown resistor R2 is typically connected to the output 182 for sensing Control Signal #1, but the resistor R2 need not be part of the contact detection circuit 180.

A second section 183 of the contact detection circuit 180 includes a thermistor 141a coupled to the negative or ground contact 148. The thermistor 141a is configured to thermally sense contact or near-contact between a wearer's finger 143 and the contact sensor 138. A third section 184 of the contact detection circuit 180 includes a second field effect transistor (FET) Q2, such as a PMOS FET, with a gate, g, coupled to voltage source Vdd, a source, s, coupled to the charging circuit line 185, and a drain, d, coupled to a charging circuit (e.g., a power management IC of charging circuitry 145) of the device 100a-100g.

An ESD (electrostatic discharge) or TVS (transient voltage suppression) diode 149 can be connected between the positive and negative charge contacts 147, 148 to prevent damage to, or unintentional activation of, the circuit 180 in response to static discharge from a user's finger 143. The ESD/TVS diode 149 preferably has a very low leakage current to avoid artificially pulling the gate of Q1 low.

When a wearer touches the contact sensor 138, the wearer's finger (or skin of the ear or head near the ear) acts as a high impedance (e.g., about 10 kΩ to 1 MΩ) applied across the charge contacts 147, 148. The application of this high impedance across the charge contacts 147, 148 pulls the gate, g, of Q1 low, thereby turning on Q1. Charge contact 147 is pulled up to the source voltage Vdd. Turning on Q1 results in a voltage signal equal to Vdd to be communicated to the output 182 as Contact Signal #1.

The second FET, Q2, is configured to prevent a touch event at the electrical contacts 147, 148 from being incorrectly interpreted as a charging event. A charging event can be initiated in response to application of a charging voltage across charge contacts 147, 148 that exceeds the source voltage, Vdd, by at least the threshold voltage, $Vgs_{th}$, of Q2. For example, the charging voltage (e.g., −5 V) that turns on Q2 for charging is greater than Vdd (e.g., 4.0 V)+$Vgs_{th}$ (e.g., 0.5 V). In other words, the source voltage, Vdd, must be less than the charge voltage, Vchg, minus the threshold voltage, $Vgs_{th}$, of Q2 (e.g., Vdd<Vchg−$Vgs_{th}$).

The thermistor 141a is coupled to the negative charge contact 148, which is the low thermal impedance output side of the circuit 180. When the wearer's finger 143 makes contact or near-contact with the contact sensor 138, the thermistor 141a immediately changes in temperature and quickly approaches the temperature of the user's finger 143. This rapid change in temperature results in a corresponding change in an analog signal which is communicated from an output 188 of the thermistor 141a (corresponding to Contact Signal #2) to a temperature ADC input of the controller 120 of the device 100a-100g. The controller 120 uses Contact Signal #1 (electrical touch signal) and Contact Signal #2 (thermal touch signal) in a manner previously described for implementing any of the contact detection techniques disclosed herein. It is noted that, unlike capacitive touch solutions, water and hair will not affect the thermistor 141a (or other temperature sensor) in the same way the finger will.

In some configurations, the additional input from an auxiliary sensor 134 (see, e.g., FIGS. 1-5) can reduce or eliminate a false reading when changing temperatures rapidly for example, walking through a doorway with a large temperature gradient. To combat false positives and make the contact sensor 138 more robust, an IMU and/or an electrical sensor (e.g., any one or combination of impedance, conductance, resistance, capacitance, electrodermal activity, and pressure sensor) can be used as an auxiliary sensor(s) 134. In the case of the IU, a double tap could be required to activate one or more physiologic sensors 140 (e.g., a PPG sensor). In the case of a capacitive contact sensor, for example, a skin-device contact event would only be recognized by the controller 120 if both the capacitance changed as well as the temperature. In some configurations, the charge contacts 146 (see, e.g., FIGS. 3-4) can be used as electrodes coupled to typical skin on/off circuits or to measure the galvanic skin resistance of the wearer's finger if it can be assured that the touch is applied between the charge contacts 146.

It is noted that the thermal path to heat generating components within the device 100a-100g to the thermistor 141a or other temperature sensor should be minimized. This can be achieved by using thin copper traces on the flex circuit board, removing solid copper ground and power planes, and/or placing thermal resistive materials between the thermistor 141a and hot components such as the rechargeable power source.

As previously discussed, the contact detection circuit 180 shown in FIG. 6 can alternatively incorporate electrical contacts 138a, 138b separate from the charge contacts 147, 148 consistent with the device configurations shown in FIGS. 1 and 2. In such configurations, several components of the circuitry shown in FIG. 6 need not be included (e.g., the charging circuit path including Q2). In some configurations, the contact detection circuit 180 need not include a temperature sensor, such as thermistor 141a, in which case the thermistor 141a and accompanying circuitry can be excluded.

FIGS. 7A and 7B illustrate an ear-worn electronic device 100d which includes a contact sensor 138 and physiologic sensor arrangement 140 in accordance with any of the embodiments disclosed herein. The device 100d includes a housing 102 having a behind-the-ear configuration suitable for deployment on the wearer's outer ear. The device 100d can be implemented as a BTE, RIC, or RITE device, for example (see also devices 100e and 100f shown in FIGS. 8 and 9). The housing 102 includes a rear surface 102a which supports a contact sensor 138 comprising charge contacts 146 (positive and negative contacts 147, 148) and a PPG sensor 140a of the physiologic sensor arrangement 140, each of which is electrically connected to a circuit board 142. The contact sensor 138 is connected to contact detection circuitry (e.g., circuit 180 shown in FIG. 6) and other components of the device 100d via the circuit board 142.

In some configurations, the device 100d includes a single PPG sensor (e.g., PPG sensor 140a, 140b or 140c). As was previously discussed, PPG sensor 140a can be co-located with the charge contacts 146 or be positioned elsewhere on the housing 102. For example, one or more elements of PPG sensor 140a (e.g., light channels) can be co-located with one or more elements of the charge contacts 146 (e.g., electrodes). Alternatively, one or more elements of PPG sensor 140a (e.g., light channels) and one or more elements of the charge contacts 146 (e.g., electrodes) can be spaced apart from one another on the housing 102. PPG sensor 140b can be situated on a housing surface 102b opposing the housing surface 102a that supports the charge contacts 146. PPG sensor 140c can be situated on a housing surface 102c that contacts skin of the wearer's outer ear or head adjacent the outer ear.

In the case of a device configuration in which PPG sensor 140a is co-located relative to the contact sensor 138 (e.g., the charge contacts 146) on the housing 102, signals produced by the PPG sensor 140a are substantially free of motion artifacts that would otherwise corrupt the PPG sensor signal due to relative movement between the PPG sensor 140a and the wearer's skin. Because the contact sensor 138 is co-located with the contact sensor 138 on the housing 102, the PPG sensor 140a becomes operational only after signals produced by the contact sensor 138 indicate the existence of good (e.g., stable) contact between the contact sensor 138/PPG sensor 140a and the wearer's skin. Co-locating the contact sensor 138 and PPG sensor 140a can advantageously eliminate the need for a motion sensor otherwise needed to reduce or eliminate motion artifacts from the PPG sensor signal. The elimination of a relatively large motion sensor (e.g., an IMU) advantageously provides for a significant reduction in the size of the ear-worn electronic device 100d.

In some configurations, the device 100d includes two or more PPG sensors (e.g., any combination of PPG sensors 140a, 140b or 140c). The multiplicity of PPG sensors can operate independently or cooperatively for sensing one or more physiologic parameters or conditions of the device wearer. For example, and as discussed previously, PPG sensors 140a and 140b can be used to concurrently sense physiologic signals from the wearer's thumb and finger, from which the device controller 120, or a processor of an external electronic device configured to operably couple to the controller 120, can produce a multisite photoplethysmogram useful for assessing and monitoring the wearer's vital signs and/or physiologic condition.

As previously discussed, an ear-worn electronic device can include a temperature sensor 141 comprising one or more temperature sensing elements 141a-141n, such as one or more thermistors. The temperature sensor 141 and controller 120 coupled thereto can be implemented to measure the temperature of a wearer's thumb or finger as previously described. The temperature sensor 141 and controller 120 coupled thereto can be implemented to measure temperature from within the wearer's ear via an in-ear (e.g., in-canal) temperature sensing element or elements as previously described. In some implementations, the temperature sensor 141 and controller 120 can be implemented to measure absolute core body temperature of the wearer from within the wearer's ear, as previously described.

Figure 8:
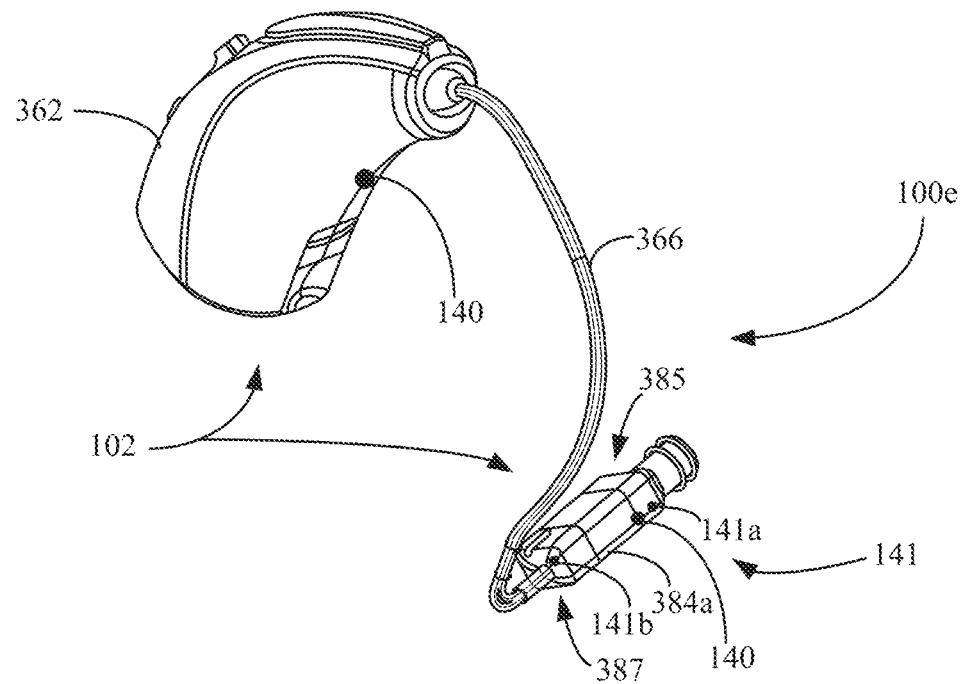
FIGS. 8 and 9 respectively illustrate ear-worn electronic device which includes a skin contact sensor and a physiologic monitoring facility comprising one or more physiologic sensors in accordance with any of the embodiments disclosed herein.
Figure 9:
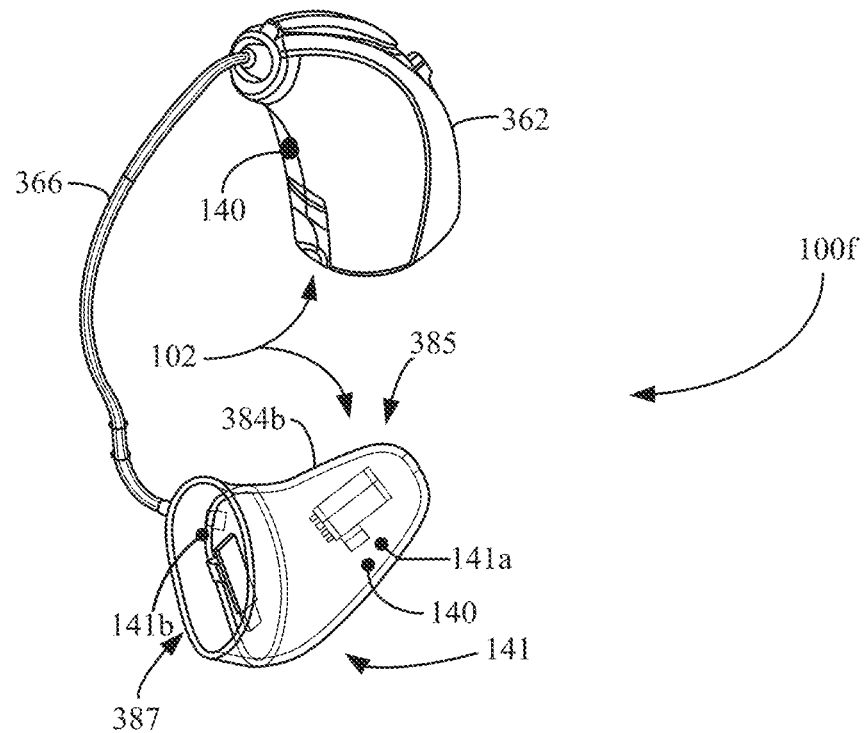

FIGS. 8 and 9 show a representative ear-worn electronic device 100e, 100f which includes an in-ear component (e.g., a receiver of a CIC component) that can be positioned within a wearer's ear canal from which one or more of physiologic, biometric, and temperature sensing can be conducted. Physiologic, biometric, and temperature measurements can be obtained in accordance with any of the embodiments disclosed herein. The ear-worn electronic device 100e, 100f is configured as a RIC device having a housing 102 comprising a case 362 configured for behind-the-ear deployment and a receiver 384a, 384b configured for deployment in the wearer's ear canal. The device 100e is representative of a conventional RIC implementation, which includes a traditional receiver 384a coupled to the case 362 via a cable 366. The device 100f is representative of a custom RIC implementation, which includes a custom receiver 384b (molded to the wearer's ear canal) coupled to the case 362 via a cable 366. The case 362 is configured for positioning behind the ear of the wearer, and the receiver 384a, 384b is configured for positioning in the ear canal. The receiver 384a, 384b includes a loudspeaker, while other electronics are housed in the case 362. A contact sensor (not shown in FIGS. 8 and 9) of a type previously described is supported by the case 362.

The receiver 384a, 384b includes an enclosure configured for insertion into the ear canal and includes a distal end 385 and a proximal end 387. In some configurations, the receiver 384a, 384b can be configured so that the distal end 385 extends into the ear canal and terminates at or prior to the first bend of the ear canal. In other configurations, the receiver 384a, 384b can be configured so that the distal end 385 extends into the ear canal beyond the first bend and terminates prior to the second bend of the ear canal (e.g., much like a CIC device). At least one physiologic sensor 140 and, optionally, one or more temperature sensing elements 141a, 141b can be supported on or in the receiver 384a, 384b. At least one physiologic sensor 140 can be situated on the case 362 of the ear-worn electronic device 100e, 100f (see, e.g., FIGS. 7A-7B). Signals generated by the physiologic sensor or sensors 140 and, optionally, one or more temperature sensing elements 141a, 141b, can be operated on by the controller 120 to sense and monitor any one or more of the wearer's vital sign disclosed herein.

For example, the physiologic sensor or sensors 140 can comprises an optical sensor configured to optically measure a physiologic parameter or physiologic condition of the wearer. The physiologic sensor or sensors 140 can be configured to produce a photoplethysmogram (PPG). The physiologic sensor or sensors 140 can include a pulse oximeter. As previously discussed, the temperature sensor 141 and controller 120 of the device 100e, 100f can be implemented to measure absolute core body temperature of the wearer from within the wearer's ear. According to such implementations, the temperature sensor 141 includes a distal temperature sensor 141a and a proximal temperature sensor 141b. The distal temperature sensor 141a is situated at a location of the receiver 384a, 384b (e.g., a forward location) that can measure the temperature of ear canal tissue (e.g., at or immediately a specified location in the ear canal discussed below). A proximal temperature sensor 141b is situated at a location of the receiver 384a, 384b spaced apart from a surface of the ear canal and proximal of the distal temperature sensor 141a in an outer ear direction (e.g., a rearward location). For example, the proximal temperature sensor 141b can be situated at or near the rear enclosure surface of the receiver 384a, 384b proximate the cable 366. An absolute core body temperature can be calculated by the controller 120, or a processor of an external electronic device operatively coupled to the controller 120, using a heat balance equation and first and second temperature signals produced by the distal temperature sensor 141a and the proximal temperature sensor 141b.

It may be desirable, but not required, for the distal temperature sensor 141a to be positioned at or near a specified location within the ear canal when the receiver 384a, 384b is fully deployed in the wearer's ear canal. This specified location is a location of the ear canal between the first and second bends that is close (e.g., nearest) to the superficial temporal artery branch of the external carotid artery. This specified location is considered the warmest region in the ear canal that is adjacent to areas reachable from the surface of the receiver 384a, 384b (e.g., configured as a CIC device). This specified location is located on the ventral side of the ear canal just past the first bend and before the second bend. More particularly, this specified location is interior to the tragus "flat" area, interior to the first bend, and exterior to the second bend on the ventral side of the ear canal.

A suitable thermistor 141a, 141b is a glass encapsulated thermistor, which includes a chip (e.g., a negative temperature coefficient (NTC) chip) encapsulated within a bead of glass. Leads (e.g., dumet leads) are coupled to the chip and to circuitry (e.g., signal processing circuitry) within or coupled to the temperature sensor 141. A suitable thermistor 141a, 141b is a surface mount device (SMD) thermistor. For example, passive thermistors as small as 1.6 mm×0.8 mm×0.8 mm that only require one additional resistor can be used, which are particularly useful for incorporation in an ear-worn device 100e, 100f and other devices disclosed herein (e.g., devices 100a-100d, 100g).

In an ear-worn device 100e, 100f that incorporates a thermistor 141a, 141b, the leads or contacts of the thermistor 141a, 141b are coupled to an analog-to-digital converter (ADC) and signal processing logic or a processor (e.g., signal processing circuitry) integral or coupled to the temperature sensor 141. Changes in thermistor resistance correspond to changes in temperature. Thermistor resistance can be converted to temperature by the processor using the well-known Steinhart-Hart equation (e.g., via a lookup table). The Steinhart-Hart equation is considered the best mathematical expression for the resistance-temperature relationship of NTC thermistors. The coefficients of the Steinhart-Hart equation vary with thermistor type and are typically provided by the manufacturer or readily derivable.

The thermistor 141a, 141b can be mounted on a surface of the receiver 384a, 384b and covered and/or surrounded by a protective, thermally conductive outer layer to provide thermal coupling between the thermistor 141a, 141b and the surrounding thermal environment. Representative examples of various thermistors 141a, 141b, mounting configurations, and signal processing techniques are disclosed in commonly owned, co-pending U.S. Published Patent Application No. 2019/0117155, which is incorporated herein by reference.

FIG. 10 is a block diagram of an ear-worn electronic device 100g which includes a skin contact sensor 138 and one or more physiologic sensors 134e in accordance with any of the embodiments disclosed herein. As previously discussed, the device 100g is representative of a wide variety of electronic devices configured to be deployed in, on or about an ear of a wearer. The device 100g shown in FIG. 10 includes several core components previously discussed, including a controller 120, rechargeable power source 144, charging circuitry 145, charge contacts 146, a communication module 130, one or more skin contact sensors 138, and one or more physiologic sensors 140. The device 100g can also include one or more temperature sensors 141 and a sensor facility 134 which includes one or more sensors which can vary in type and technology. As was previously discussed, the sensor facility 134 can include one or more of a motion sensor(s) 134a, optical sensor(s) 134b, electrical sensor(s) 134c, and pressure sensor(s) 134d. An ear-worn electronic device 100g which includes a skin contact sensor 138, one or more physiologic sensors 134e, and some or all of the core components listed above can serve as a vital signs sensing and monitoring device in accordance with any of the embodiments disclosed herein.

In accordance with any of the embodiments disclosed herein, the device 100g can be configured as a hearing device or a hearable which includes an audio processing facility 170. The audio processing facility 170 includes audio signal processing circuitry 176 coupled to a speaker or receiver 172 and optionally to one or more microphones 174 coupled to the audio signal processing circuitry 176. In other embodiments, the device 100g is devoid of the audio processing facility 170. The device 100g can also incorporate a communication facility 130 configured to effect communications with a companion device 100g and/or an external electronic device, system and/or the cloud. The communication facility 130 can include one or both of an RF transceiver/antenna and/or an NFMI transceiver/antenna.

According to embodiments that incorporate the audio processing facility 170, the device 100g can be implemented as a hearing assistance device that can aid a person with impaired hearing. For example, the device 100g can be implemented as a monaural hearing aid or a pair of devices 100g can be implemented as a binaural hearing aid system. The monaural device 100g or a pair of devices 100g can be configured to effect bi-directional communication (e.g., wireless communication) of data with an external source, such as a remote server via the Internet or other communication infrastructure. The device or devices 100g can be configured to receive streaming audio (e.g., digital audio data or files) from an electronic or digital source. Representative electronic/digital sources (e.g., accessory devices) include an assistive listening system, a streaming device (e.g., a TV streamer or audio streamer), a remote microphone, a radio, a smartphone, a laptop, a cell phone/entertainment device (CPED) or other electronic device that serves as a source of digital audio data, control and/or settings data or commands, and/or other types of data files.

According to any of the embodiments disclosed herein, an ear-worn electronic device 100a-100g can be configured to communicatively couple to, and cooperatively operate with, any of the external electronic devices and systems (and/or the cloud) described herein. According to implementations where the ear-worn electronic device 100a-100g has limited processing power, energy storage, or memory, the physiologic sensor data acquired by the ear-worn electronic device 100a-100g can be offloaded to a wirelessly connected device, such as a smart watch/phone, or uploaded to the cloud. For example, raw physiologic sensor data acquired by the ear-worn electronic device 100a-100g can be communicated to an external electronic device (e.g., smart device, cloud server/processor), which can then process the raw physiologic sensor data, such as by computing various physiologic metrics discussed herein. The external electronic device can be configured to communicate an audible message to report the computed physiologic metrics (and/or other information, e.g., an alert in the case of a concerning physiologic metric) back to the ear-worn electronic device 100a-100g, which saves processing power, electrical power, and memory storage of the audio messages at the ear-worn electronic device 100a-100g.

The controller 120 shown in FIG. 10 (and the controller 120 shown in other figures) can include one or more processors or other logic devices. For example, the controller 120 can be representative of any combination of one or more logic devices (e.g., multi-core processor, digital signal processor (DSP), microprocessor, programmable controller, general-purpose processor, special-purpose processor, hardware controller, software controller, a combined hardware and software device) and/or other digital logic circuitry (e.g., ASICs, FPGAs), and software/firmware configured to implement the functionality disclosed herein. The controller 120 can incorporate or be coupled to various analog components (e.g., analog front-end), ADC and DAC components, and Filters (e.g., FIR filter, Kalman filter). The controller 120 can incorporate or be coupled to memory. The memory can include one or more types of memory, including ROM, RAM, SDRAM, NVRAM, EEPROM, and FLASH, for example.

Figure 11:
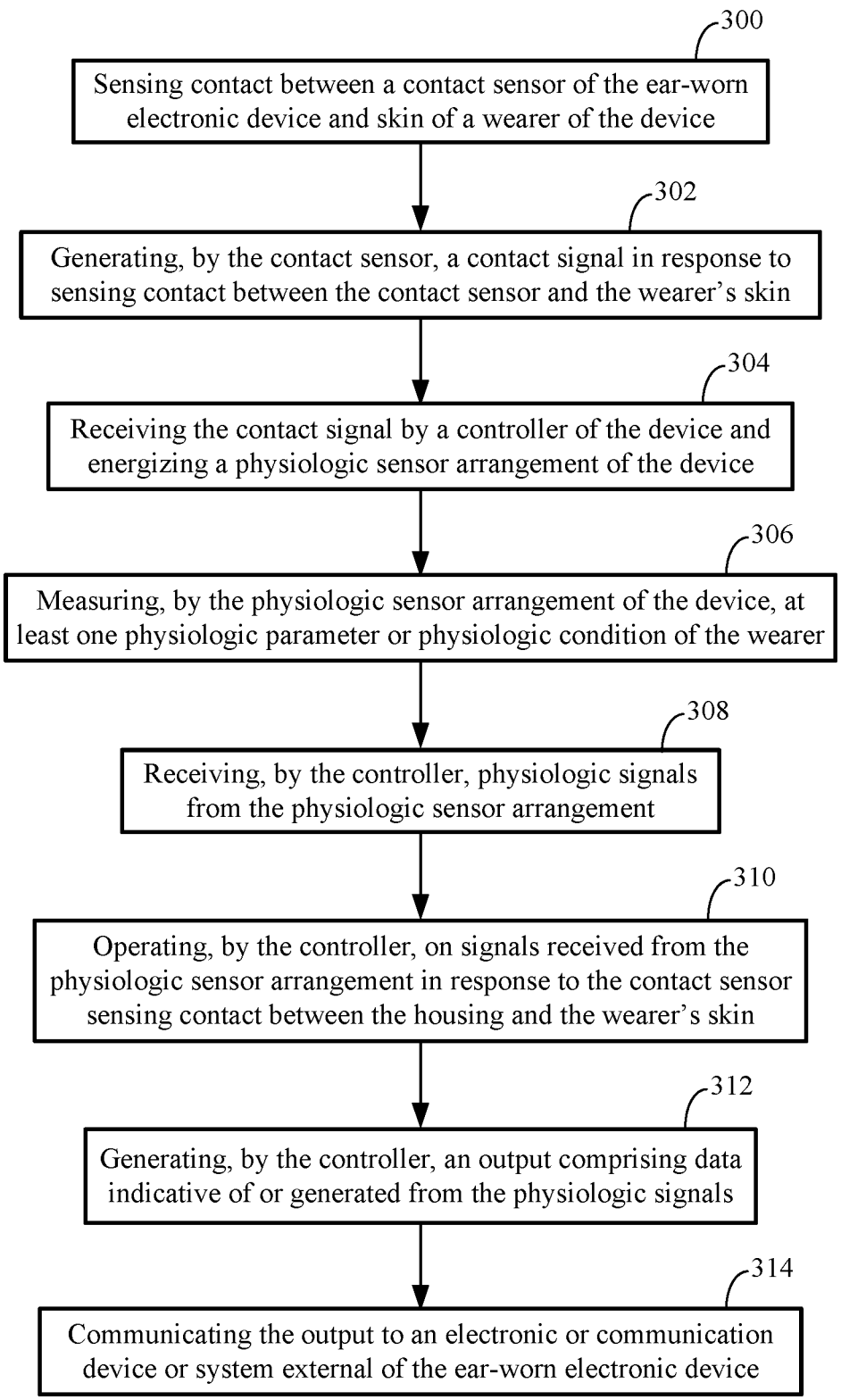
FIG. 11 illustrates a method of measuring at least one physiologic parameter or physiologic condition of a wearer of an ear-worn electronic device in accordance with any of the embodiments disclosed herein.

FIG. 11 illustrates a method of measuring at least one physiologic parameter or physiologic condition of a wearer of an ear-worn electronic device in accordance with any of the embodiments disclosed herein. The method shown in FIG. 11 involves sensing contact 300 between a contact sensor of the ear-worn electronic device and skin of a wearer of the device. The skin of the wearer can be one or more of skin within the ear (e.g., ear canal), skin of the outer ear or of the head proximate the outer ear, and a body part other than the ear (e.g., forehead, torso, finger, thumb). The method involves generating 302, by the contact sensor, a contact signal in response to sensing contact between the contact sensor and the wearer's skin. The method also involves receiving 304 the contact signal by a controller of the device and energizing a physiologic sensor arrangement of the device in response to the contact signal. The method further involves measuring 306, by the physiologic sensor arrangement of the device, at least one physiologic parameter or physiologic condition of the wearer.

The method involves receiving 308, by the controller, physiologic signals from the physiologic sensor arrangement. The method also involves operating 310, by the controller, on signals received from the physiologic sensor arrangement in response to the contact sensor sensing contact between the housing and the wearer's skin. The method further involves generating 312, by the controller, an output comprising data indicative of or generated from the physiologic signals, and communicating 314 the output to an electronic or communication device or system external of the ear-worn electronic device.

Although reference is made herein to the accompanying set of drawings that form part of this disclosure, one of at least ordinary skill in the art will appreciate that various adaptations and modifications of the embodiments described herein are within, or do not depart from, the scope of this disclosure. For example, aspects of the embodiments described herein may be combined in a variety of ways with each other. Therefore, it is to be understood that, within the scope of the appended claims, the claimed invention may be practiced other than as explicitly described herein.

All references and publications cited herein are expressly incorporated herein by reference in their entirety into this disclosure, except to the extent they may directly contradict this disclosure. Unless otherwise indicated, all numbers expressing feature sizes, amounts, and physical properties used in the specification and claims may be understood as being modified either by the term "exactly" or "about." Accordingly, unless indicated to the contrary, the numerical parameters set forth in the foregoing specification and attached claims are approximations that can vary depending upon the desired properties sought to be obtained by those skilled in the art utilizing the teachings disclosed herein or, for example, within typical ranges of experimental error.

The recitation of numerical ranges by endpoints includes all numbers subsumed within that range (e.g. 1 to 5 includes 1, 1.5, 2, 2.75, 3, 3.80, 4, and 5) and any range within that range. Herein, the terms "up to" or "no greater than" a number (e.g., up to 50) includes the number (e.g., 50), and the term "no less than" a number (e.g., no less than 5) includes the number (e.g., 5).

The terms "coupled" or "connected" refer to elements being attached to each other either directly (in direct contact with each other) or indirectly (having one or more elements between and attaching the two elements). Either term may be modified by "operatively" and "operably," which may be used interchangeably, to describe that the coupling or connection is configured to allow the components to interact to carry out at least some functionality (for example, a radio chip may be operably coupled to an antenna element to provide a radio frequency electric signal for wireless communication).

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the disclosure.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

As used herein, "have," "having," "include," "including," "comprise," "comprising" or the like are used in their open-ended sense, and generally mean "including, but not limited to." It will be understood that "consisting essentially of," "consisting of," and the like are subsumed in "comprising," and the like. The term "and/or" means one or all of the listed elements or a combination of at least two of the listed elements.

The phrases "at least one of," "comprises at least one of," and "one or more of" followed by a list refers to any one of the items in the list and any combination of two or more items in the list.

What is claimed is:

1. An ear-wearable electronic device, comprising:
a housing configured to be worn in, at or about an ear of a wearer;
audio processing circuitry disposed in or supported by the housing and comprising one or more microphones and an acoustic transducer;
a controller disposed in the housing and coupled to the audio processing circuitry;
a power source disposed in the housing;
a contact sensor supported by the housing and coupled to the controller, the contact sensor configured to sense contact between the device and skin of the wearer; and
a physiologic sensor arrangement coupled to the controller and configured to measure at least one physiologic parameter or physiologic condition of the wearer;
wherein the controller is configured to energize the physiologic sensor arrangement in response to the contact sensor sensing contact between the device and the wearer's skin, operate on signals received from the energized physiologic sensor arrangement in response to the contact sensor sensing contact between the device and the wearer's skin, and terminate energizing the physiologic sensor arrangement in response to the contact sensor sensing an absence of contact between the device and the wearer's skin.

2. The device according to claim 1, wherein the contact sensor is configured to one or both of sense contact between the device and skin of the wearer's finger and sense contact between the device and skin of the wearer's ear.

3. The device according to claim 1, wherein one or more elements of the physiologic sensor arrangement and the contact sensor are co-located on the housing.

4. The device according to claim 1, wherein the physiologic sensor arrangement comprises an optical sensor configured to optically measure the physiologic parameter or physiologic condition of the wearer.

5. The device according to claim 1, wherein the physiologic sensor arrangement comprises an optical sensor configured to produce a photoplethysmogram (PPG).

6. The device according to claim 5, wherein, in response to receiving signals from the optical sensor, the controller is configured to measure one or more of the wearer's heart rate, cardiac cycle, cardiac rhythm, cardiac arrhythmia, heart rate variability, oxygen saturation, respiration, hypovolemia, hypervolemia, blood pressure, and depth of anesthesia.

7. The device according to claim 5, further comprising:
a motion sensor disposed in the housing;
wherein the controller is configured to reduce or eliminate motion artifacts in signals produced by the PPG sensor using signals produced by the motion sensor.

8. The device according to claim 1, wherein:
the physiologic sensor arrangement comprises an optical sensor arrangement comprising:
a first optical sensor configured to make a first physiologic measurement at the wearer's ear; and
a second optical sensor configured to make a second physiologic measurement at the wearer's finger or thumb, and
the controller is configured to produce a multisite photoplethysmogram (PPG) using the first and second physiologic measurements.

9. The device according to claim 1, wherein the physiologic sensor arrangement comprises one or both of:
a temperature sensor arrangement configured to measure an absolute core body temperature of the wearer; and
an optical sensor configured to optically measure the physiologic parameter or physiologic condition of the wearer.

10. The device according to claim 1, wherein the physiologic sensor arrangement comprises a temperature sensor arrangement configured and arranged in or on the housing to measure an absolute core body temperature of the wearer at the wearer's forehead.

11. The device according to claim 1, wherein:
- the physiologic sensor arrangement comprises an electrical sensor configured to contact the wearer's skin;
- the power source comprises a rechargeable power source coupled to charging circuitry;
- the charging circuitry comprises first and second charge contacts situated at a wall of the housing; and
- the first and second charge contacts define electrical contacts of the electrical sensor.

12. A method of measuring at least one physiologic parameter or physiologic condition of a wearer of an ear-worn electronic device, comprising:
- generating, by a contact sensor of the device, a contact signal in response to sensing contact between the contact sensor and skin of the wearer;
- energizing, by a controller of the device, a physiologic sensor arrangement of the device in response to receiving the contact signal;
- measuring, by the physiologic sensor arrangement, at least one physiologic parameter or physiologic condition of the wearer;
- operating, by the controller, on signals received from the energized physiologic sensor arrangement in response to the contact sensor sensing contact between the contact sensor and the wearer's skin;
- terminating energizing the physiologic sensor arrangement in response to the contact sensor sensing an absence of contact between the device and the wearer's skin;
- generating, by the controller, an output comprising data indicative of or generated from the physiologic sensor arrangement signals; and
- communicating the output to an electronic or communication device or system external of the ear-worn electronic device.

13. The method according to claim 12, comprising one or both of:
- sensing, by the contact sensor, contact between the device and skin of the wearer's finger; and
- sensing, by the contact sensor, contact between the device and skin of the wearer's ear.

14. The method according to claim 12, wherein the physiologic sensor arrangement produces a photoplethysmogram (PPG).

15. An ear-worn electronic device, comprising:
- a housing configured to be worn in, at or about an ear of a wearer;
- audio processing circuitry disposed in or supported by the housing and comprising one or more microphones and an acoustic transducer;
- a controller disposed in the housing and coupled to the audio processing circuitry;
- a power source disposed in the housing;
- a contact sensor supported by the housing and coupled to the controller, the contact sensor configured to sense contact between the device and skin of the wearer; and
- an optical physiologic sensor arrangement coupled to the controller and configured to measure at least one physiologic parameter or physiologic condition of the wearer, and the contact sensor and one or more elements of the optical physiologic sensor arrangement are co-located in or on the housing;
- wherein the controller is configured to energize the physiologic sensor arrangement in response to the contact sensor sensing contact between the device and the wearer's skin, operate on signals received from the energized physiologic sensor arrangement in response to the contact sensor sensing contact between the device and the wearer's skin, and terminate energizing the physiologic sensor arrangement in response to the contact sensor sensing an absence of contact between the device and the wearer's skin.

16. The device according to claim 15, wherein the contact sensor is configured and arranged on the housing to one or both of:
- sense contact between the device and skin of the wearer's finger; and
- sense contact between the device and skin of the wearer's ear.

17. The device according to claim 15, wherein the optical physiologic sensor arrangement is configured to produce a photoplethysmogram (PPG).

* * * * *